(12) United States Patent
Suemasu et al.

(10) Patent No.: US 8,502,191 B2
(45) Date of Patent: Aug. 6, 2013

(54) SEMICONDUCTOR DEVICE, MANUFACTURING METHOD THEREFOR, AND SOLAR CELL

(75) Inventors: Takashi Suemasu, Tsukuba (JP); Noritaka Usami, Sendai (JP)

(73) Assignees: University of Tsukuba, Tsukuba-shi (JP); Tohoku University, Sendai-shi (JP)

( * ) Notice: Subject to any disclaimer, the term of this patent is extended or adjusted under 35 U.S.C. 154(b) by 90 days.

(21) Appl. No.: 13/318,913

(22) PCT Filed: May 11, 2010

(86) PCT No.: PCT/JP2010/057936
§ 371 (c)(1),
(2), (4) Date: Nov. 4, 2011

(87) PCT Pub. No.: WO2010/131639
PCT Pub. Date: Nov. 18, 2010

(65) Prior Publication Data
US 2012/0049150 A1    Mar. 1, 2012

(30) Foreign Application Priority Data

May 12, 2009  (JP) .................................. 2009-115337
Aug. 10, 2009 (JP) .................................. 2009-185666

(51) Int. Cl.
| H01L 29/06 | (2006.01) |
| H01L 31/0328 | (2006.01) |
| H01L 31/0336 | (2006.01) |
| H01L 31/072 | (2012.01) |
| H01L 31/109 | (2006.01) |
| H01L 21/20 | (2006.01) |
| H01L 21/36 | (2006.01) |

(52) U.S. Cl.
USPC .............. 257/12; 257/E21.101; 257/E29.006; 438/508

(58) Field of Classification Search
USPC .............. 257/12, E21.101, E29.006; 438/508
See application file for complete search history.

(56) References Cited

U.S. PATENT DOCUMENTS 4,036,727 A * 7/1977 Rahn .............................. 204/268
(Continued)

FOREIGN PATENT DOCUMENTS
| JP | 8-162659 | 6/1996 |
| JP | 2000-501238 | 2/2000 |

(Continued)

OTHER PUBLICATIONS

Ichikawa et al Growth of BaSi2/CoSi2/Si Structure by MEB and Characterization of the Same textbook for the 10$^{th}$ Summer School on semiconducting silicides (2007) pp. 70-71.*

(Continued)

*Primary Examiner* — David S Blum
(74) *Attorney, Agent, or Firm* — Kratz, Quintos & Hanson, LLP

(57) ABSTRACT

A semiconductor device includes: a silicon layer (12); an intermediate silicide layer (28) that is provided on the silicon layer (12), has openings, and includes barium silicide; and an upper silicide layer (14) that covers the intermediate silicide layer (28), is positioned to be in contact with the silicon layer (12) through the openings, has a higher dopant concentration than the dopant concentration of the intermediate silicide layer (28), and includes barium silicide.

14 Claims, 21 Drawing Sheets

U.S. PATENT DOCUMENTS

| | | | |
|---|---|---|---|
| 4,131,486 A * | 12/1978 | Brandhorst, Jr. | 136/255 |
| 6,133,590 A | 10/2000 | Ashley | |
| 2009/0044862 A1 | 2/2009 | Suemasu | |
| 2010/0252097 A1 | 10/2010 | Suemasu | |
| 2011/0062446 A1 * | 3/2011 | Goyal | 257/64 |

FOREIGN PATENT DOCUMENTS

| | | |
|---|---|---|
| JP | 2002-50790 A1 | 2/2002 |
| JP | 2008-66719 A1 | 3/2008 |
| JP | 2009-76895 A1 | 4/2009 |
| WO | WO 2009/028560 A1 | 3/2009 |

OTHER PUBLICATIONS

Y. Inomata, et al.; "Epitaxial Growth of Semiconducting BaSi2 Films on Si(111) Substrates by Molecular Beam Epitaxy;" Japanese Journal of Applied Physics; vol. 43; No. 4A; 2004; L478-481/p. 2 of specification.

O. Nast, et al.; "Elucidation of the layer exchange mechanism in the formation of polycrystalline silicon by aluminum-induced crystallization;" Journal of Applied Physics; vol. 88; No. 1; Jul. 1, 2000; pp. 124-132 and cover sheet (10 Sheets total)/p. 2 of specification.

International Search Report for International Application No. PCT/JP2010/057936 dated Aug. 24, 2010.

* cited by examiner

○ 90
◌ 92

SEMICONDUCTOR DEVICE, MANUFACTURING METHOD THEREFOR, AND SOLAR CELL

TECHNICAL FIELD

The present invention relates to semiconductor devices, methods of manufacturing the semiconductor devices, and solar cells, and more particularly, to a semiconductor device that includes a silicon layer and a layer including barium silicide, and a method of manufacturing the semiconductor device, and a solar cell.

BACKGROUND ART

Solar cells using BaSi layers including Ba (barium) and Si (silicon) have been developed (Patent Literatures 1 and 2). BaSi has a wider bandgap than Si, and Sr (strontium) is added to a BaSi layer to obtain a bandgap of 1.4 eV, which is suitable for solar cells. In this manner, higher energy conversion efficiency can be achieved. To lower costs and obtain a smaller film thickness, a BaSi layer is preferably formed on an insulating substrate such as a glass substrate. As a method of forming a BaSi layer on a glass substrate, formation of (111)-oriented Si on a glass substrate is disclosed in Non-Patent Literature 1. Patent Literatures 1 and 2, and Non-Patent Literature 2 disclose techniques for forming a BaSi layer on (111)-oriented Si.

[Patent Literature]

Patent Literature 1: Japanese Laid-Open Patent Publication No. 2008-66719

Patent Literature 2: International Publication Pamphlet No. WO 2009/028560

[Non-Patent Literature]

Non-Patent Literature 1: J. Appl. Phys. Vol. 88, 124 (2000)

Non-Patent Literature 2: Jpn. J. Appl. Phys. Vol. 43, No. 4A, L478 (2004)

DISCLOSURE OF THE INVENTION

Problems to be Solved by the Invention

If a solar cell using a BaSi layer having a pn junction can be realized, higher solar cell performance can be achieved. However, where a BaSi layer having a pn junction is formed on a Si layer, it is difficult to obtain excellent electrical contact between the Si layer and the BaSi layer. That is, it is difficult to obtain excellent electrical contact between a silicon layer and a silicide layer including barium silicide.

The present invention has been made in view of the above problem, and an object thereof is to provide a semiconductor device that can obtain excellent electrical contact between a silicon layer and a silicide layer including barium silicide, a method of manufacturing the semiconductor device, and a solar cell.

Means for Solving the Problems

The present invention is a semiconductor device that includes: a silicon layer; an intermediate silicide layer that is provided on the silicon layer, has openings, and includes barium silicide; and an upper silicide layer that covers the intermediate silicide layer, is positioned to be in contact with the silicon layer through the openings, has a higher dopant concentration than the dopant concentration of the intermediate silicide layer, and includes barium silicide. According to the present invention, excellent electrical contact can be obtained between the silicon layer and the silicide layer.

In the above structure, the aperture ratio of the openings may be 0.5 or higher and be lower than 1. In this structure, the contact resistance between the silicon layer and the silicide layer can be made lower.

In the above structure, the silicon layer may have a higher dopant concentration than the dopant concentration of the intermediate silicide layer.

In the above structure, the silicon layer and the upper silicide layer may be of different conductivity types from each other.

In the above structure, the silicon layer and the upper silicide layer may form a tunnel junction.

In the above structure, the intermediate silicide layer and the upper silicide layer may be made of barium silicide.

The present invention is a method of manufacturing a semiconductor device. This method includes: forming an intermediate silicide layer on a silicon layer, the intermediate silicide layer having openings to expose the surface of the silicon layer, the intermediate silicon layer including barium silicide; and forming an upper silicide layer to cover the intermediate silicide layer and be in contact with the silicon layer through the openings, the upper silicide layer having a higher dopant concentration than that of the intermediate silicide layer, the upper silicide layer including barium silicide. The intermediate silicide layer is formed by depositing barium on the silicon layer and causing the barium to react with the silicon layer. According to the present invention, excellent electrical contact can be obtained between the silicon layer and the silicide layer.

In the above structure, the upper silicide layer may be formed by simultaneously vapor-depositing a dopant, silicon, and barium on the intermediate silicide layer and the silicon layer.

The present invention is a solar cell that includes: a silicon layer; a tunnel junction layer formed on the silicon layer; a pn junction that is formed on the tunnel junction layer and includes a silicide layer including barium silicide; a first electrode having carriers supplied thereinto from the silicon layer; and a second electrode having carriers supplied thereinto from the silicide layer. According to the present invention, excellent electrical contact can be obtained between the silicon layer and the silicide layer.

In the above structure, the silicon layer may be of a first conductivity type. The tunnel junction layer may include: a tunnel silicon layer that is formed on the silicon layer, has a higher dopant concentration than the dopant concentration of the silicon layer, and is of the first conductivity type; and a tunnel silicide layer that is formed on the tunnel silicon layer, is of a second conductivity type, and includes barium silicide, the second conductivity type being the opposite conductivity type of the first conductivity type. The silicide layer may include: a second silicide layer that is formed on the tunnel junction layer, has a lower dopant concentration than the dopant concentration of the tunnel silicide layer, is of the second conductivity type, and includes barium silicide; and a first silicide layer that is formed on the second silicide layer, is of the first conductivity type, and includes barium silicide. In this structure, a pn junction can be formed in the silicide layer with a simple layer structure.

The above structure may further include an intermediate silicide layer that is formed at an interface between the tunnel silicon layer and the tunnel silicide layer, has openings to allow direct contact between the tunnel silicon layer and the tunnel silicide layer, has a lower dopant concentration than the dopant concentration of the tunnel silicide layer, and includes barium silicide. In this structure, the contact resistance between the tunnel silicon layer and the tunnel silicide layer can be made lower.

In the above structure, the aperture ratio of the openings may be 0.5 or higher and be lower than 1. In this structure, the contact resistance between the silicon layer and the silicide layer can be made lower.

In the above structure, the silicide layer may be made of barium silicide.

In the above structure, the silicide layer may be made of strontium-barium silicide. With this structure, the conversion efficiency of the solar cell can be increased.

Effects of the Invention

The present invention can provide a semiconductor device that can obtain excellent electrical contact between a silicon layer and a silicide layer including barium silicide, a method of manufacturing the semiconductor device, and a solar cell.

BEST MODES FOR CARRYING OUT THE INVENTION

The following is a detailed description of embodiments of the present invention, with reference to the accompanying drawings.

[Embodiment 1]

Figure 1:
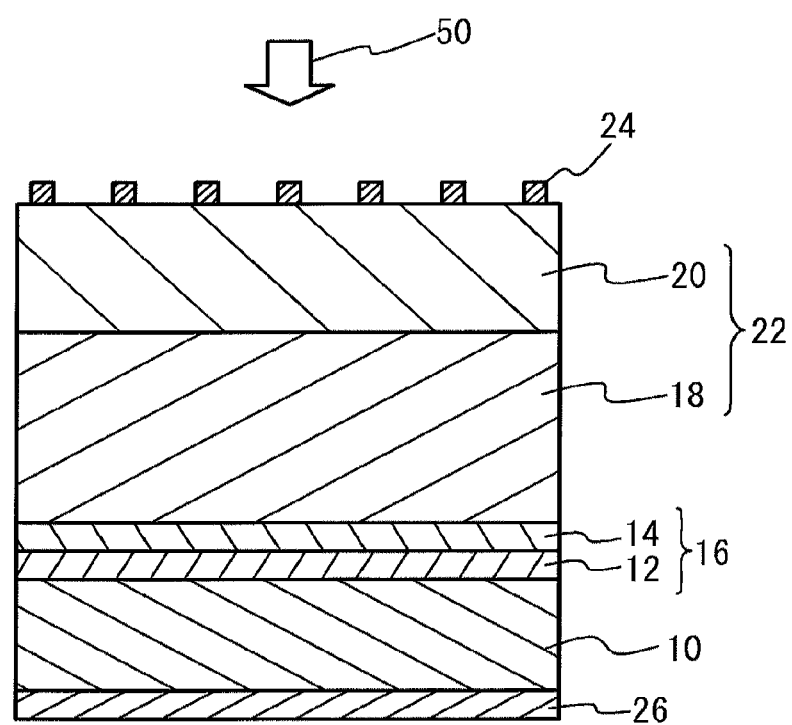
FIG. 1 is a cross-sectional view of a solar cell according to Embodiment 1.

FIG. 1 is a cross-sectional view of a solar cell according to Embodiment 1. A tunnel junction layer 16 is formed on a Si layer 10 having a first conductivity type (p-type, for example). The Si layer 10 includes a dopant such as B (boron), Al (aluminum), or Ga (gallium). The dopant concentration in the Si layer 10 is preferably $1 \times 10^{16}$ to $1 \times 10^{18}$ cm$^{-3}$, for example. A Si substrate of several hundreds of μm in film thickness can be used as the Si layer 10. Also, a Si thin film of 50 to 500 nm in film thickness formed on a glass substrate or the like can be used, for example.

The tunnel junction layer 16 includes a tunnel Si layer 12 and a tunnel BaSi layer 14. The tunnel Si layer 12 and the tunnel BaSi layer 14 form a tunnel junction. The tunnel Si layer 12 is formed on the Si layer 10, and is a layer of the first conductivity type (p-type, for example) with a higher dopant concentration than that of the Si layer 10. The tunnel Si layer 12 preferably has a dopant such as B or Al, a film thickness of 10 to 50 nm, for example, and a dopant concentration of $1 \times 10^{19}$ to $1 \times 10^{20}$ cm$^{-3}$, for example. The tunnel BaSi layer 14 is formed on the tunnel Si layer 12, and is a layer of a second conductivity type (n-type, for example) with a higher dopant concentration than that of the later described second BaSi layer 18. The tunnel BaSi layer 14 preferably has a dopant such as Sb (antimony) or As (arsenic), a film thickness of 10 to 50 nm, for example, and a dopant concentration of $1 \times 10^{19}$ to $1 \times 10^{20}$ cm$^{-3}$, for example.

A BaSi layer 22 having a pn junction is formed on the tunnel junction layer 16. The BaSi layer 22 includes a second BaSi layer 18 of the second conductivity type (n-type, for example) formed on the tunnel junction layer 16, and a first BaSi layer 20 of the first conductivity type (p-type, for example) formed on the second BaSi layer 18. The first BaSi layer 20 and the second BaSi layer 18 form a pn junction. The second BaSi layer 18 preferably has a dopant such as Sb or As, a film thickness of 500 to 1000 nm, for example, and a dopant concentration of $1 \times 10^{16}$ to $5 \times 10^{16}$ cm$^{-3}$, for example. The first BaSi layer 20 preferably has a dopant such as Al, a film thickness of 50 to 100 nm, for example, and a dopant concentration of $5 \times 10^{17}$ to $5 \times 10^{18}$ cm$^{-3}$, for example.

A second electrode 24 that supplies carriers into the first BaSi layer 20 of the BaSi layer 22 is formed on the BaSi layer 22. The second electrode 24 is preferably made of a metal such as Al, and preferably has openings through which light 50 passes. A first electrode 26 that supplies carriers into the Si layer 10 is formed under the Si layer 10. The first electrode 26 is made of a metal such as Al.

The tunnel BaSi layer 14, the second BaSi layer 18, the first BaSi layer 20, and the intermediate BaSi layer described in Embodiment 2 include Ba and Si, and are barium silicide layers, for example. The stoichiometric composition of barium silicide is BaSi$_2$, but those layers may have a different composition from the stoichiometric composition. The tunnel BaSi layer 14, the second BaSi layer 18, the first BaSi layer 20, and the intermediate BaSi layer may include Sr, for example, in addition to barium silicide. That is, those layers may be mixed crystal layers of barium silicide and strontium silicide. Particularly, where the tunnel BaSi layer 14, the second BaSi layer 18, the first BaSi layer 20, and the intermediate BaSi layer are $Ba_{0.5}Sr_{0.5}Si_2$ layers, for example, the energy bandgap Eg can be 1.4 eV. With this arrangement, a high-efficiency solar cell that can be formed as a thin film can be provided. Alternatively, those layers may be mixed crystal layers of barium silicide and a silicide other than strontium silicide. For example, the tunnel BaSi layer 14, the second BaSi layer 18, the first BaSi layer 20, and the intermediate BaSi layer may include Mg (magnesium) or a Group II element (or an alkaline-earth metal) such as Ca (calcium), and may be mixed crystal layers of magnesium silicide or calcium silicide, and barium silicide. For example, those layers may be alkaline-earth metal silicide layers include at least barium silicide. The tunnel BaSi layer 14, the second BaSi layer 18, the first BaSi layer 20, and the intermediate BaSi layer preferably include the elements described above as examples, so that the energy bandgap becomes 1.4 to 1.7 eV, which is suitable for solar cells.

Figure 2:
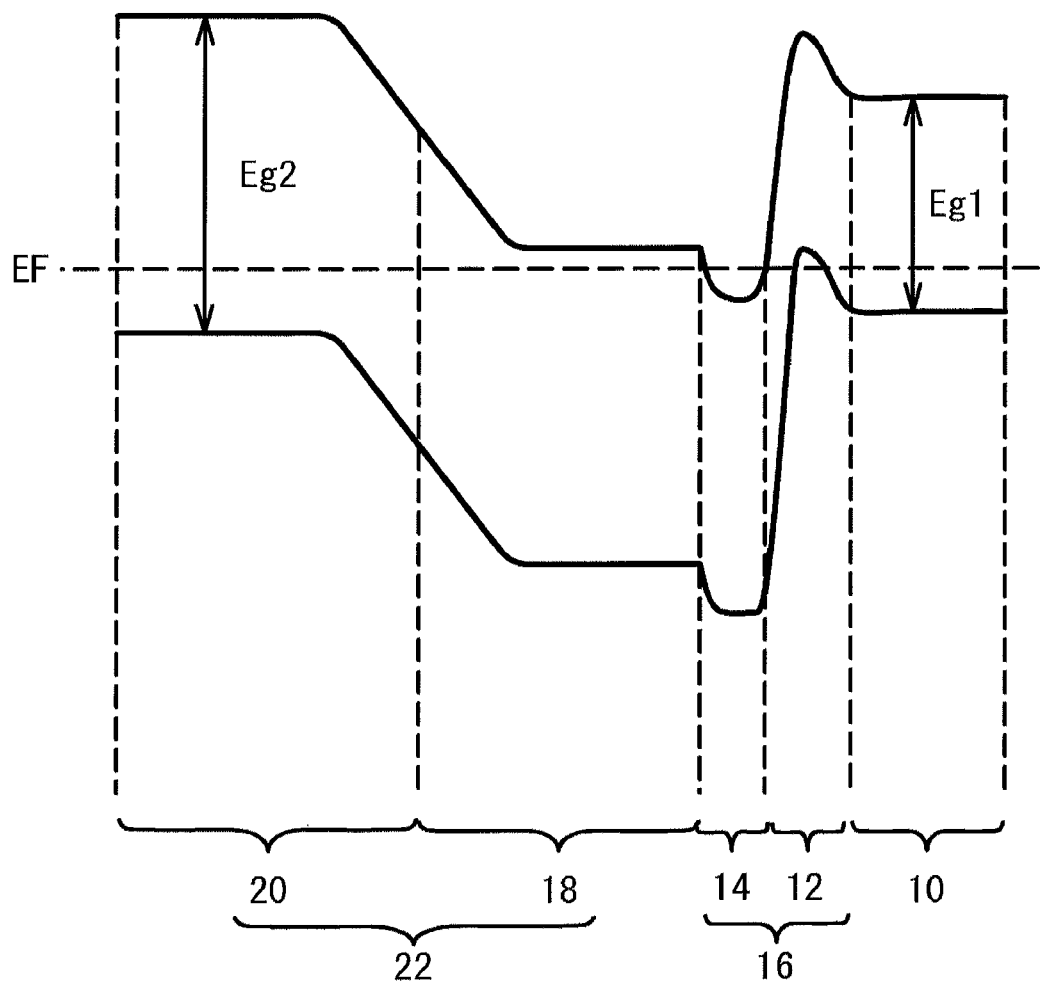
FIG. 2 is an energy band diagram of the semiconductor layers in the solar cell according to Embodiment 1.

FIG. 2 is an energy band diagram of the semiconductor layers in the solar cell according to Embodiment 1. In the diagram, EF represents Fermi level. The Si layer 10 has an energy bandgap Eg1, and the BaSi layer 22 has an energy bandgap Eg2. Since the BaSi layer 22 with a large bandgap forms a pn junction, a high-efficiency solar cell that can be formed as a thin film can be provided.

The tunnel Si layer 12 has a higher dopant concentration than that of the Si layer 10. The tunnel BaSi layer 14 has a higher dopant concentration than that of the tunnel BaSi layer 14. With this arrangement, the tunnel Si layer 12 and the tunnel BaSi layer 14 can form the tunnel junction layer 16. Carriers can tunnel through the tunnel junction layer 16. Accordingly, the Si layer 10 and the second BaSi layer 18 can be brought into ohmic contact with each other.

As disclosed in Patent Literatures 1 and 2, a high-quality BaSi layer can be obtained by forming a BaSi layer on a (111)-oriented Si layer, for example. However, it has become apparent that, if the BaSi layer 22 having a pn junction is formed directly on the Si layer 10, the contact resistance between the Si layer 10 and the BaSi layer 22 becomes higher. This is because the electron affinity of the BaSi layer 22 is as low as 3.3 eV while the electron affinity of the Si layer 10 is 4.0 eV, and a barrier against carriers is formed between the Si layer 10 and the BaSi layer 22.

According to Embodiment 1, a tunnel junction layer is formed between the Si layer 10 and the BaSi layer 22 having a pn junction. With this arrangement, the electrical contact characteristics between the Si layer 10 and the BaSi layer 22 can be improved. In this manner, the contact resistance between the Si layer 10 and the BaSi layer 22 can be made lower.

Also, to form a tunnel junction, the Si layer 10 and the tunnel Si layer 12 preferably have the same conductivity type (the first conductivity type), and the dopant concentration of the tunnel Si layer 12 is preferably higher than that of the Si layer 10. Also, the second BaSi layer 18 and the tunnel BaSi layer 14 preferably have the same conductivity type (the second conductivity type), and the dopant concentration of the tunnel BaSi layer 14 is preferably higher than that of the second BaSi layer 18. By providing the tunnel junction layer 16 on the Si layer 10, the tunnel Si layer 12 is made to have the same conductivity type as that of the Si layer 10, and the tunnel BaSi layer 14 is made to have a different conductivity type from that of the Si layer 10. Therefore, the second BaSi layer 18 having a different conductivity type from that of the Si layer 10 is formed on the tunnel BaSi layer 14, and the first BaSi layer 20 is made to have the same conductivity type as that of the Si layer 10. Accordingly, a pn junction can be formed in the BaSi layer 22 with a simple layer structure.

In the above described example, the first conductivity type is p-type, and the second conductivity type, which is the opposite conductivity type of the first conductivity type, is n-type. Alternatively, the first conductivity type may be n-type, and the second conductivity type is p type. However, if the Si layer 10 is formed by the method disclosed in Non-Patent Literature 1, the Si layer 10 is of p-type. Therefore, where the Si layer 10 and the BaSi layer 22 having a pn junction are brought into contact with each other through a tunnel junction, the second BaSi layer 18 on the side of the Si layer 10 is preferably of n-type, and the first BaSi layer 22 on the surface side is preferably of p-type. Thus, the first conductivity type is preferably p-type, and the second conductivity type is preferably n-type.

[Embodiment 2]

Embodiment 2 is an example of the structure of the tunnel junction in Embodiment 1, and an example of a method of forming the tunnel junction. In a case where a tunnel junction is formed as in Embodiment 1, each of the tunnel Si layer 12 and the tunnel BaSi layer 14 is formed to have a film thickness of 50 nm or smaller, for example. However, it is difficult to form a high-quality BaSi layer with a high dopant concentration and a small film thickness on a Si layer. Embodiment 2 is an example of a method of forming a high-quality thin BaSi layer on a Si layer.

Figure 3A:
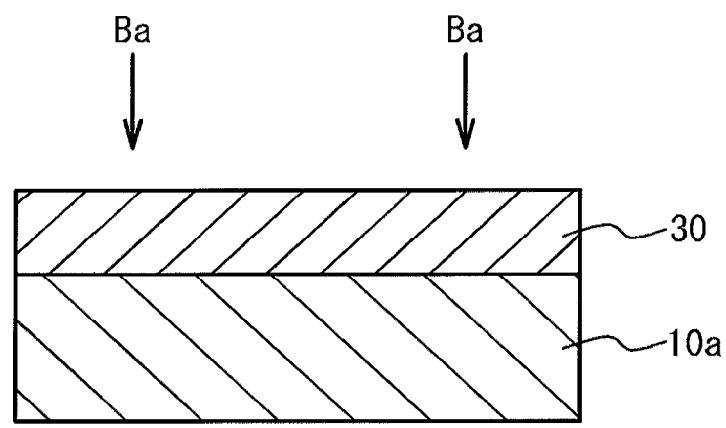
FIGS. 3A and 3B are cross-sectional views illustrating a film forming method according to Comparative Example 1.
Figure 3B:
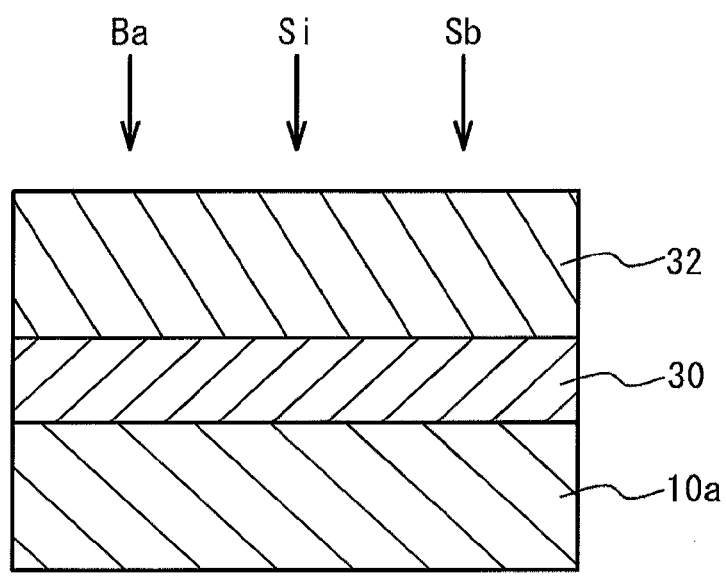

First, a film forming method for forming a high-quality BaSi layer 32 on a Si layer 10a according to Comparative Example 1 is described. FIGS. 3A through 3B are cross-sectional views illustrating the film forming method according to Comparative Example 1. As shown in FIG. 3A, a Ba layer 33 is formed on the (111)-oriented Si layer 10a by using a vapor deposition technique or the like. At this point, the substrate temperature is set at such a temperature that Si and Ba react with each other to form barium silicide. For example, the substrate temperature is set at 450 to 700° C. A Ba layer 33 and the Si layer 10a then react with each other, to form a template BaSi layer 30. In this manner, the template BaSi layer 30 is formed by using RDE (Reactive Deposition Epitaxy). A conductive BaSi layer 32 having a dopant introduced thereinto is formed on the template BaSi layer 30 by using MBE (Molecular Beam Epitaxy).

Since the conductive BaSi layer 32 is formed by using the template BaSi layer 30 as the template, the high-quality conductive BaSi layer 32 can be formed in Comparative Example 1. However, any dopant is not added to the template BaSi layer 30, and the film thickness of the template BaSi layer 30 is approximately 20 nm. Therefore, the contact resistance between the conductive BaSi layer 32 and the Si layer 10a becomes higher. In some cases, to form a higher-quality conductive BaSi layer 32, an undoped BaSi layer is formed on the template BaSi layer 30 by using MBE, and the conductive BaSi layer 32 is formed on the undoped BaSi layer. In that case, the contact resistance between the conductive BaSi layer 32 and the Si layer 10a becomes even higher. Therefore, in Comparative Example 2, introduction of a dopant was considered at the time of formation of the template BaSi layer 30 by RDE.

Figure 4A:
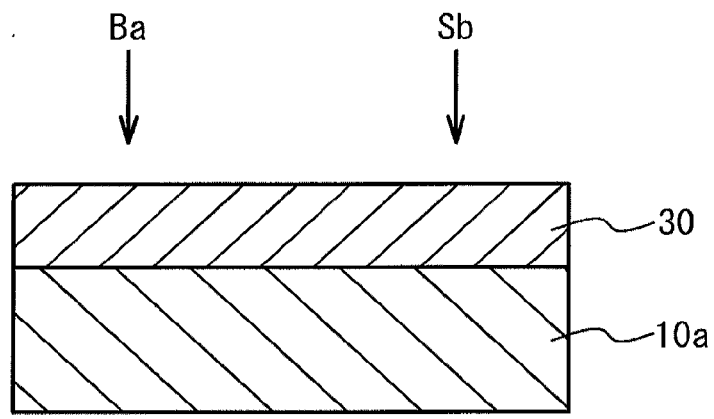
FIGS. 4A and 4B are cross-sectional views illustrating a film forming method according to Comparative Example 2.
Figure 4B:
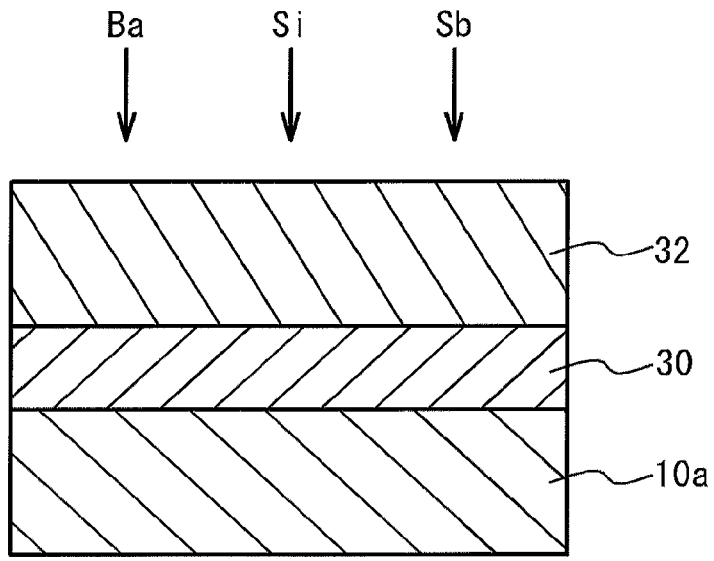

FIGS. 4A and 4B are cross-sectional views illustrating a film forming method according to Comparative Example 2. A B-doped p-type Si wafer having a (111) plane as the principal plane was used as the Si layer 10a. The hole concentration in the Si layer 10a is approximately $6 \times 10^{17}$ $cm^{-3}$. As shown in FIG. 4A, Sb is vapor-deposited on the Si layer 10a, with Ba being a dopant. At this point, the substrate temperature is such a temperature that Ba reacts with Si. In this manner, the template BaSi layer 30 is formed.

The conditions for forming the template BaSi layer 30 are as follows:
Film forming method: RDE
Substrate temperature: 550° C.
Ba film forming rate: 1.55 nm/min.
Sb cell temperature: 250° C.
Film forming period: approximately 5 minutes As shown in FIG. 4B, Sb, Ba, and Si were vapor-deposited on the template BaSi layer 30 by using MBE, and the conductive BaSi layer 32 having Sb as a dopant was formed.

The conditions for forming the conductive BaSi layer 32 are as follows:
Film forming method: MBE
Substrate temperature: 550° C.
Ba film forming rate: 2.6 nm/min.
Si film forming rate: 1.55 nm/min.
Sb cell temperature: 250° C.
Film forming period: approximately 60 minutes As the Sb cell temperature is set to 250° C., the electron concentration of the later described conductive BaSi layer 32 of Embodiment 2 is approximately $10^{20}$ cm$^{-3}$.

Figure 5A:
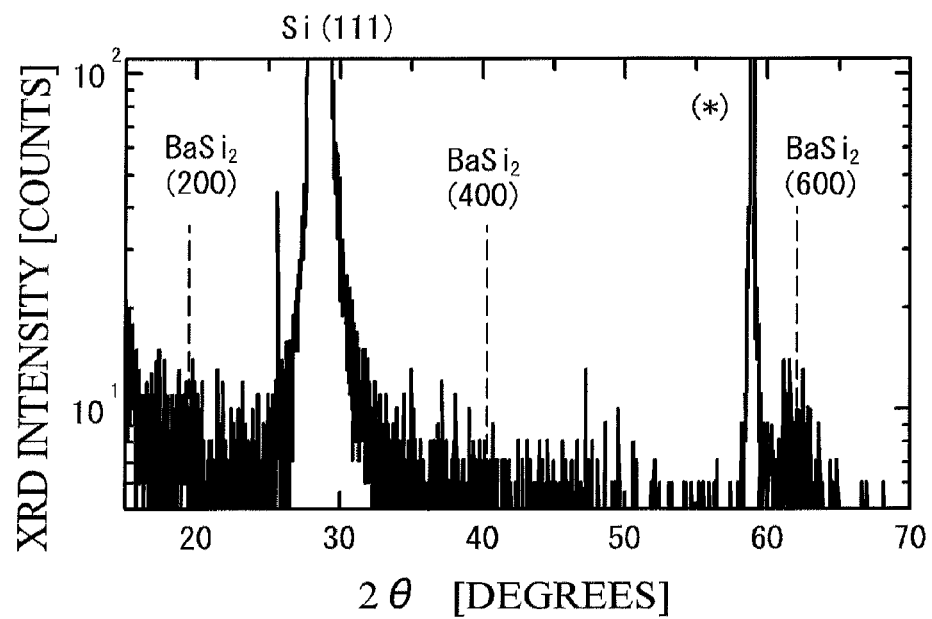
FIG. 5A is a graph showing the XRD pattern of the template BaSi layer 30 of Comparative Example 2 illustrated in FIG. 4A.
Figure 5B:
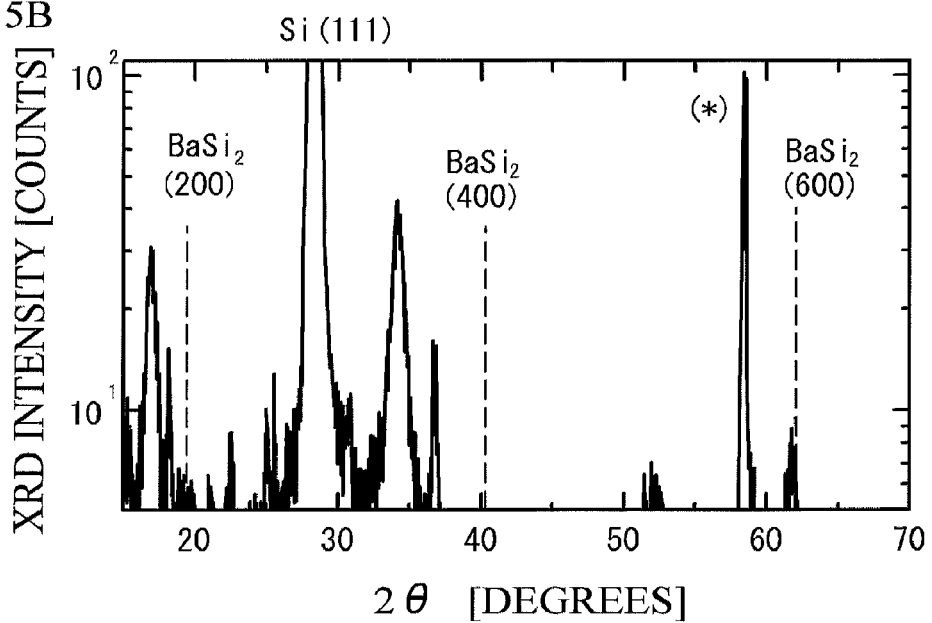
FIG. 5B is a graph showing the XRD pattern of the conductive BaSi layer 32 of Comparative Example 2 illustrated in FIG. 4B.

FIG. 5A is a graph showing the XRD (X-ray diffraction) pattern of the template BaSi layer 30 of Comparative Example 2 illustrated in FIG. 4A. As shown in FIG. 5A, the peak corresponding to the (111) plane of Si is observed, but the peaks corresponding to the (200), (400), and (600) planes of BaSi$_2$ are not observed. In view of this, it is apparent that the template BaSi layer 30 is not a preferred crystal structure. It should be noted that the peak indicated by (*) is a peak that is observed at the location of the (222) plane of Si, but is reflected repeatedly by crystal planes. Therefore, the peak indicated by (*) is not the peak of the (222) plane of Si. FIG. 5B is a graph showing the XRD pattern of the conductive BaSi layer 32 of Comparative Example 2 illustrated in FIG. 4B. As shown in FIG. 5B, the peak corresponding to the (111) plane of Si is observed, but the peaks corresponding to the (200), (400), and (600) planes of BaSi$_2$ are not observed. In view of this, it is apparent that the conductive BaSi layer 32 is not a preferred crystal structure.

As shown in Embodiment 2, it has become apparent that, where a dopant is introduced into the template BaSi layer 30 by using RDE, the crystal characteristics of the template BaSi layer 30 and the conductive BaSi layer 32 are degraded. Therefore, in Comparative Example 3, a conductive BaSi layer was formed directly on the Si layer 10a by using MBE.

Figure 6A:
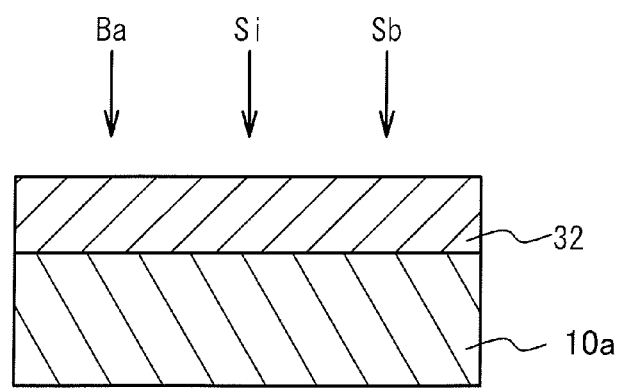
FIG. 6A is a cross-sectional view illustrating a film forming method according to Comparative Example 3.

FIG. 6A is a cross-sectional view illustrating a film forming method according to Comparative Example 3. As shown in FIG. 6A, Sb, Ba, and Si were vapor-deposited on the Si layer 10a, which is the same as that of Comparative Example 2, by using MBE, and the conductive BaSi layer 32 having Sb as a dopant was formed directly on the template BaSi layer 30.

Figure 6B:
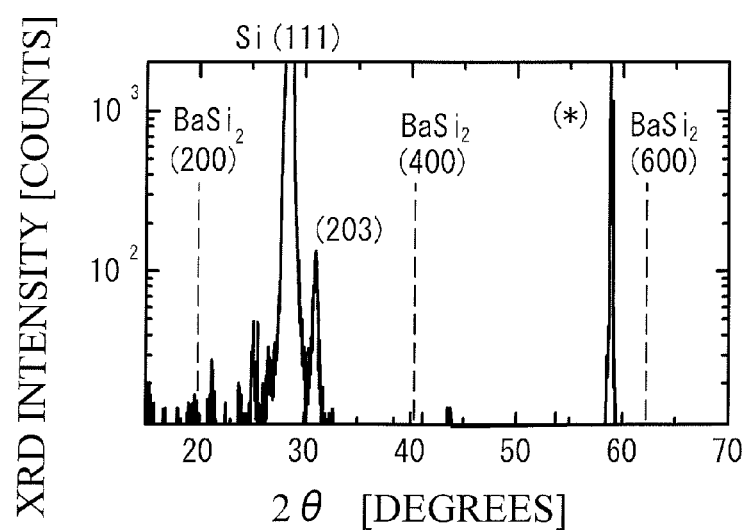
FIG. 6B is a graph showing the XRD pattern of a sample film formed by the method according to Comparative Example 3.

The conditions for forming the conductive BaSi layer 32 are as follows:
Film forming method: MBE
Substrate temperature : 550° C.
Ba film forming rate: 2.6 nm/min.
Si film forming rate: 1.55 nm/min.
Sb cell temperature: 250° C.
Film forming period: approximately 60 minutes FIG. 6B is a graph showing the XRD pattern of the sample film formed by the method according to Comparative Example 3. As shown in FIG. 6B, the peak corresponding to the (111) plane of Si is observed, but the peaks corresponding to the (200), (400), and (600) planes of BaSi$_2$ are not observed. In view of this, it is apparent that the conductive BaSi layer 32 is not a preferred crystal structure either in Comparative Example 3.

As described above, where a dopant is introduced into the template BaSi layer 30 so as to make the template BaSi layer 30 conductive, a preferred conductive BaSi layer 32 cannot be formed as in Comparative Example 2 illustrated in FIG. 5B. Where the conductive BaSi layer 32 is formed directly on the Si layer 10a, a preferred conductive BaSi layer 32 cannot be formed as in Comparative Example 3 illustrated in FIG. 6B. In the following, Embodiment 2 to solve those problems is described.

Figure 7A:
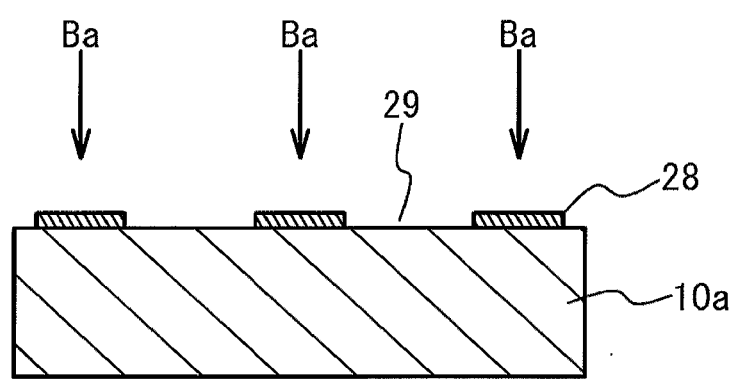
FIGS. 7A and 7B are diagrams illustrating a film forming method according to Embodiment 2.
Figure 7B:
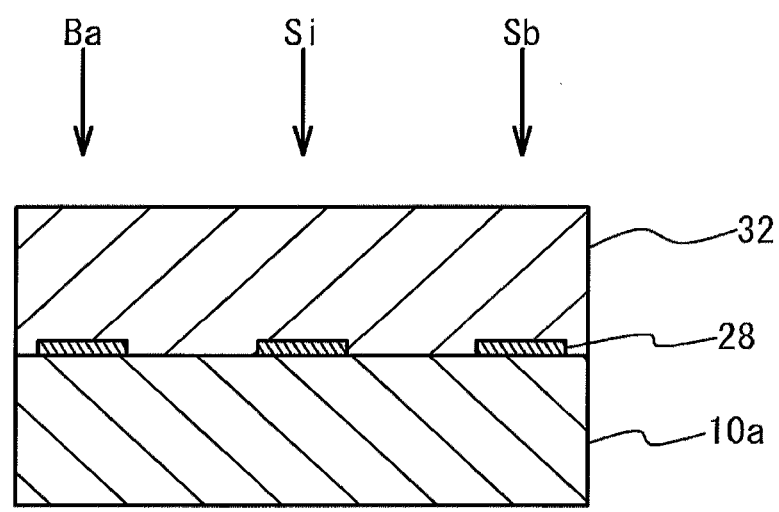

FIGS. 7A and 7B are diagrams illustrating a film forming method according to Embodiment 2. As shown in FIG. 7A, a very thin Ba film was vapor-deposited on the Si layer 10a, which is the same as that of Comparative Example 2. At this point, the substrate temperature is such a temperature that Ba reacts with Si. In this manner, an intermediate BaSi layer 28 is formed.

The conditions for forming the intermediate BaSi layer 28 are as follows:
Film forming method: RDE
Substrate temperature: 550° C.
Ba film forming rate: 1.55 nm/min.
Film forming period: approximately 0.5 minute Since the vapor deposition amount of Ba is very small, the Ba does not cover the entire surface of the Si layer 10a. Therefore, the intermediate BaSi layer 28 that has openings 29 to expose the surface of the Si layer 10a, and includes Ba and Si is formed on the Si layer 10a.

As shown in FIG. 7B, Sb, Ba, and Si were simultaneously vapor-deposited by using MBE. In this manner the conductive BaSi layer 32 that covers the intermediate BaSi layer 28 and is in contact with the Si layer 10a via the openings 29 was formed.

The conditions for forming the conductive BaSi layer 32 are as follows:
Film forming method: MBE
Substrate temperature: 550° C.
Ba film forming rate: 2.6 nm/min.
Si film forming rate: 1.55 nm/min.
Sb cell temperature: 250° C.
Film forming period: approximately 60 minutes In this manner, by performing the Sb film formation at the same time, the conductive BaSi layer 32 can be introduced, with Sb being a dopant.

Figure 8:
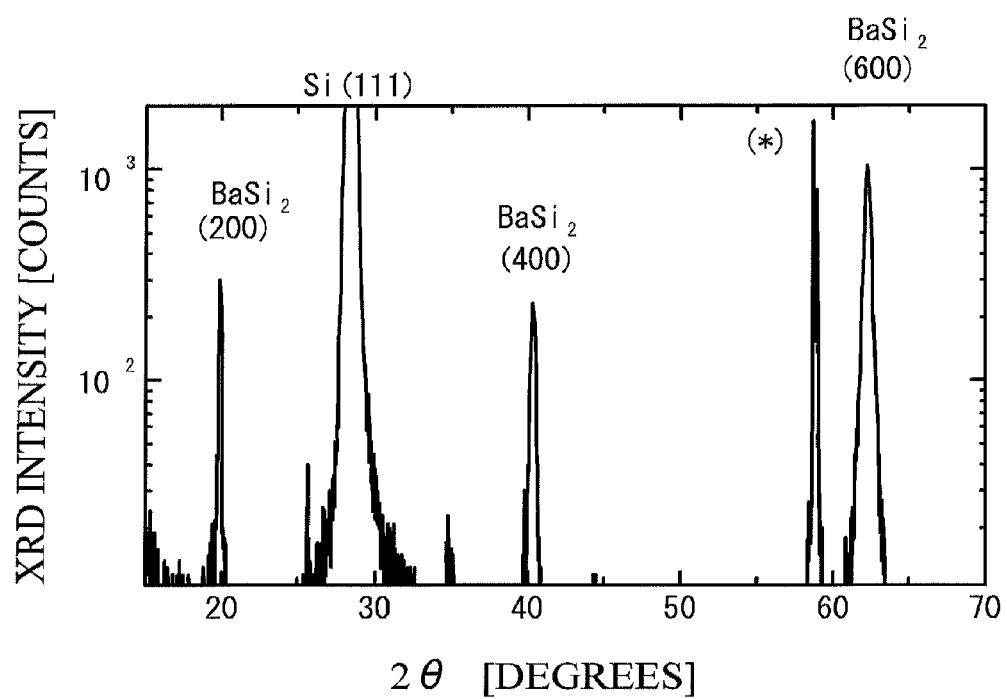
FIG. 8 is a graph showing the XRD pattern of the conductive BaSi layer 32 formed by the method according to Embodiment 2.

FIG. 8 is a graph showing the XRD pattern of the conductive BaSi layer 32 formed by the method according to Embodiment 2. The peaks of the (200), (400), and (600) planes of BaSi$_2$ are observed. This indicates that an α-axis oriented BaSi$_2$ layer is formed on a (111)-oriented Si layer. In this manner, the conductive BaSi layer 32 having excellent crystal characteristics was formed.

Figure 9A:
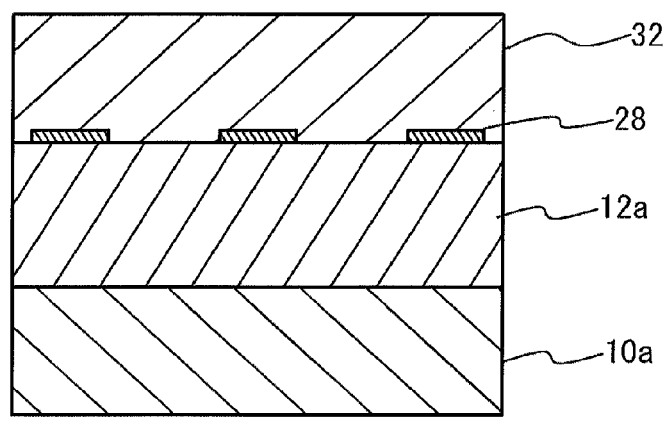
FIG. 9A is a cross-sectional view of a sample film formed by the method according to Embodiment 2.
Figure 9B:
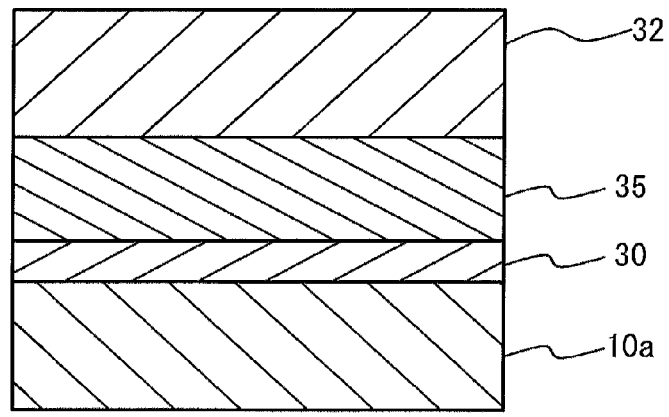
FIG. 9B is a cross-sectional view of a sample film formed by a method according to Comparative Example 4.

Next, the contact characteristics between the Si layer 10a and the conductive BaSi layer 32 were measured. FIG. 9A is a cross-sectional view of a sample film formed by the method according to Embodiment 2. FIG. 9B is a cross-sectional view of a sample film formed by a method according to Comparative Example 4. As shown in FIG. 9A, a high-concentration Si layer 12a is formed on the p-type Si layer 10a, the same intermediate BaSi layer 28 as that of FIGS. 7A and 7B is formed on the high-concentration Si layer 12a, and the n-type conductive BaSi layer 32 is formed on the intermediate BaSi layer 28. The Si layer 10a is a B-doped (111) substrate having a hole concentration of approximately $6\times10^{17}$ cm$^{-3}$.

The conditions for forming the high-concentration Si layer 12a are as follows:
Film forming method: MBE
Substrate temperature: 700° C.
Dopant: simultaneous vapor deposition of B, Si, and HBO$_3$ The hole concentration of the high-concentration Si layer 12a is approximately $5\times10^{19}$ cm$^{-3}$, and the film thickness is 70 nm.

The method of forming the intermediate BaSi layer 28 is the same as that of Embodiment 1. The substrate temperature at the time of film formation of the conductive BaSi layer 32, the Ba and Si film forming rates, and the Sb cell temperature are the same as those of FIG. 7B. The film forming period for the conductive BaSi layer 32 is set so that the film thickness becomes 140 nm. Table 1 is a table that shows the dopants, the conductivity types, the carrier densities, and the film thicknesses of the respective layers of a sample film formed by the method according to Embodiment 2. The film thickness of the intermediate BaSi layer 28 is a film thickness estimated from the film forming period.

TABLE 1

| LAYER NAME | DOPANT | CONDUCTIVE TYPE | CONCENTRATION | FILM THICKNESS |
|---|---|---|---|---|
| CONDUCTIVE BaSi LAYER 32 | Sb | n | $10^{20}$ cm$^{-3}$ | 140 nm |
| INTERMEDIATE BaSi LAYER 28 | UNDOPED | n | $10^{16}$ cm$^{-3}$ | 1 nm |
| HIGH-CONCENTRATION Si LAYER 12a | B | p | $5 \times 10^{19}$ cm$^{-3}$ | 70 nm |
| Si LAYER 10a | B | p | $6 \times 10^{17}$ cm$^{-3}$ | — |

As shown in FIG. 9B, in Comparative Example 4, the template BaSi layer 30 is formed on the Si layer 10a, an undoped BaSi layer 35 is formed on the template BaSi layer 30, and the conductive BaSi layer 32 is formed on the undoped BaSi layer 35. The Si layer 10a is a B-doped (111) substrate having a hole concentration of approximately $6 \times 10^{17}$ cm$^{-3}$.

The conditions for forming the template BaSi layer 30 are as follows:
Film forming method: RDE
Substrate temperature: 550° C.
Ba film forming rate: 1.55 nm/min.
Film forming period: set so that the film thickness becomes 20 nm The conditions of forming the undoped BaSi layer 35 are as follows:
Film forming method: MB
Substrate temperature: 550° C.
Ba film forming rate: 2.6 nm/min.
Si film forming rate: 1.55 nm/min.
Film forming period: approximately 60 minutes The undoped BaSi layer 35 is intentionally undoped, but the electron concentration is approximately $10^{16}$ cm$^{-3}$ as a result of Hall effect measurement.

The conditions for forming the conductive BaSi layer 32 are as follows:
Film forming method: MBE
Substrate temperature: 550° C.
Ba film forming rate: 2.6 nm/min.
Si film forming rate: 1.55 nm/min.
Sb cell temperature: 250° C.
Film forming period: approximately 60 minutes Table 2 is a table that shows the dopants, the conductivity types, the carrier densities, and the film thicknesses of the respective layers of a sample film formed by the method according to Comparative Example 4.

Figure 11A:
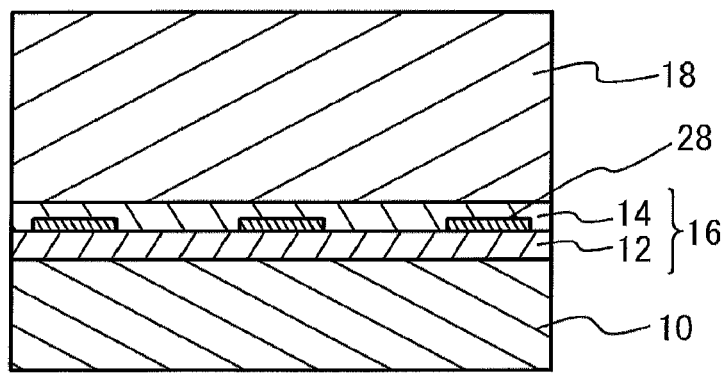
FIG. 11A is a cross-sectional view of a sample film formed by the method according to Embodiment 2.

Next, a tunnel junction structure was formed by using the film forming method according to Embodiment 2. FIG. 11A is a cross-sectional view of a sample film formed by the method according to Embodiment 2. In Embodiment 2, the tunnel Si layer 12 is formed on the p-type Si layer 10, the intermediate BaSi layer 28 is formed on the tunnel Si layer 12, the tunnel BaSi layer 14 is formed on the intermediate BaSi layer 28, and the second BaSi layer 18 is formed on the tunnel BaSi layer 14. The Si layer 10 is a B-doped (111) substrate having a hole concentration of approximately $6 \times 10^{17}$ cm$^{-3}$. The tunnel Si layer 12 has B as the dopant, a hole concentration of approximately $5 \times 10^{19}$ cm$^{-3}$, and a film thickness of 70 nm. The conditions for forming the tunnel Si layer 12 are the same as those for forming the high-concentration Si layer 12a of FIG. 9A. The intermediate BaSi layer 28 has a film thickness of approximately 1 nm. The conditions for forming the intermediate BaSi layer 28 are the same as those of FIG. 9A. The tunnel BaSi layer 14 has Sb as the dopant, an electron concentration of approximately $10^{20}$ cm$^{-3}$, and a film thickness of 140 nm. The conditions for forming the tunnel BaSi layer 14 are the same as those for forming the conductive BaSi layer 32 of FIG. 9B. The second BaSi layer 18 is intentionally undoped, but has an electron concentration of approximately $10^{16}$ cm$^{-3}$ and a film thickness of 520 nm.

Figure 11B:
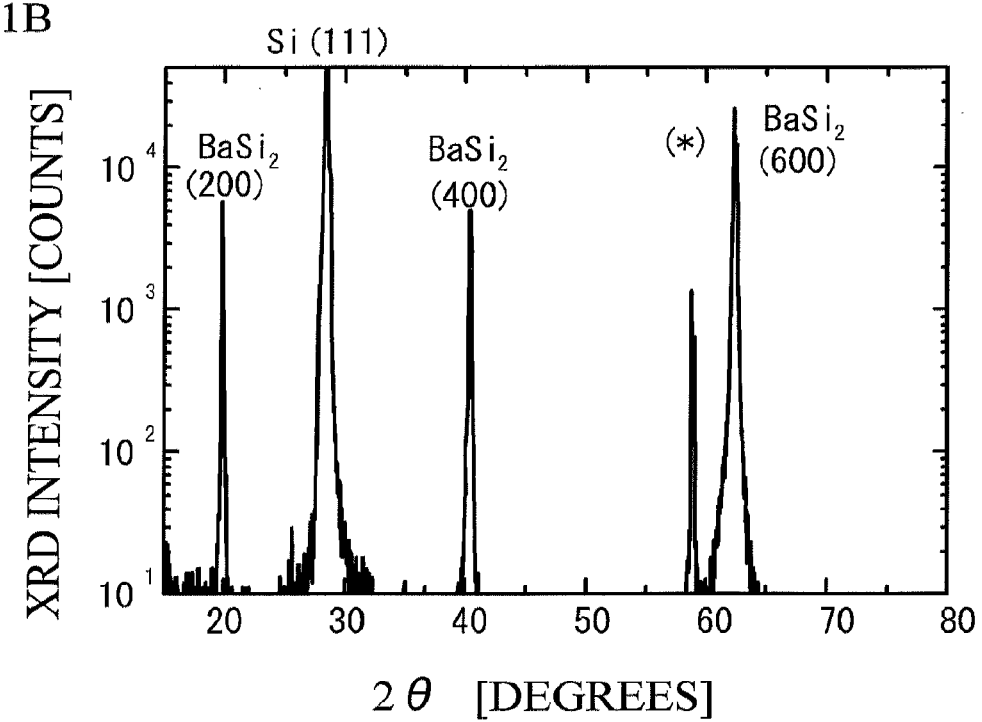
FIG. 11B is a graph showing the XRD pattern of the second BaSi layer 18 formed by the method according to Embodiment 2.

The conditions for forming the second BaSi layer 18 are as follows:
Film forming method: MBE
Substrate temperature: 550° C.
Ba film forming rate: 2.6 nm/min.
Si film forming rate: 1.55 nm/min.
Film forming period: 60 minutes FIG. 11B is a graph showing the XRD pattern of the second BaSi layer 18 formed by the method according to Embodiment 2. As shown in FIG. 11B, the peaks of the (200), (400), and (600) planes of BaSi$_2$ are observed. In this manner, the

TABLE 2

| LAYER NAME | DOPANT | CONDUCTIVE TYPE | CONCENTRATION | FILM THICKNESS |
|---|---|---|---|---|
| CONDUCTIVE BaSi LAYER 32 | Sb | n | $10^{20}$ cm$^{-3}$ | 60 nm |
| UNDOPED BaSi LAYER 35 | UNDOPED | n | $10^{16}$ cm$^{-3}$ | 220 nm |
| TEMPLATE BaSi LAYER 30 | UNDOPED | n | $10^{16}$ cm$^{-3}$ | 20 nm |
| Si LAYER 10a | B | p | $6 \times 10^{17}$ cm$^{-3}$ | — |

Figure 10:
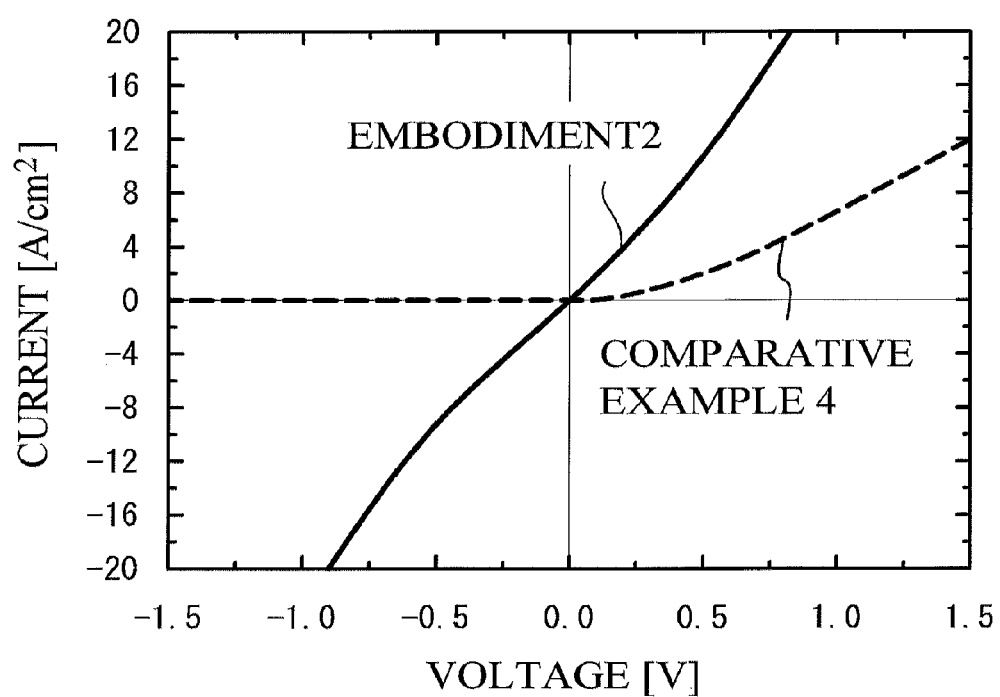
FIG. 10 is a graph showing the current-voltage characteristics between the Si layer 10a and the conductive BaSi layer 32 of each of a sample film formed by the method according to Embodiment 2 and a sample film formed by the method according to Comparative Example 4.

FIG. 10 is a graph showing the current-voltage characteristics between the Si layer 10a and the conductive BaSi layer 32 of each of the sample film formed by the method according to Embodiment 2 illustrated in FIG. 9A and the sample film formed by the method according to Comparative Example 4 illustrated in FIG. 9B. As shown in FIG. 10, in Comparative Example 4, the current-voltage characteristics are rectifying characteristics. In Embodiment 2, on the other hand, ohmic characteristics are obtained. In this manner, in Embodiment 2, the current flowing in the tunnel junction layer 16 exhibits ohmic characteristics, and excellent contact characteristics can be obtained between the conductive BaSi layer 32 and the Si layer 10a.

Figure 12:
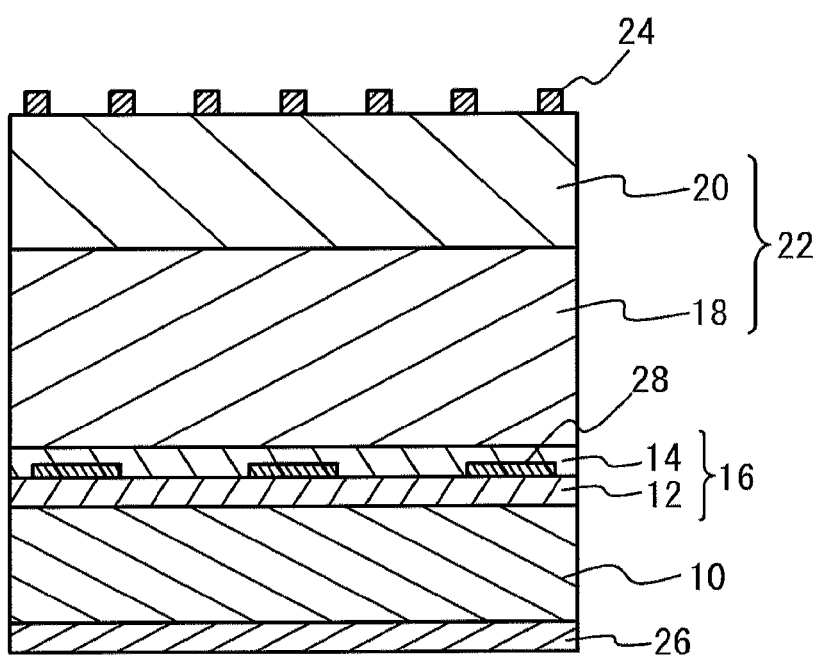
FIG. 12 is a cross-sectional view of a solar cell manufactured by using a method according to Embodiment 2.

FIG. 12 is a cross-sectional view of a solar cell manufactured by the method according to Embodiment 2. As shown in FIG. 12, the solar cell manufactured by the method according to Embodiment 2 differs from that of Embodiment 1 in that the intermediate BaSi layer 28 having openings is formed on the tunnel Si layer 12. The other aspects of the structure are the same as those of Embodiment 1, and therefore, explanation of them is omitted herein. The solar cell manufactured by the method according to Embodiment 2 is formed as follows. The first BaSi layer 20 is formed on the second BaSi layer 18 of FIG. 11A, and the second electrode 24 is formed on the first BaSi layer 20. The first electrode 26 is formed under the Si layer 10.

As shown in FIG. 7A, in Embodiment 2, the intermediate BaSi layer 28 having the openings 29 to expose the surface of the tunnel Si layer 12 is formed on the tunnel Si layer 12 of FIG. 12 (equivalent to the Si layer 10a in FIG. 7A). At this point, any dopant is not added to the intermediate BaSi layer 28. Accordingly, the α-axis oriented intermediate BaSi layer 28 can be formed on the Si layer 10a. As shown in FIG. 7B, the tunnel BaSi layer 14 of FIG. 12 (equivalent to the conductive BaSi layer 32 in FIG. 7B) is formed to cover the intermediate BaSi layer 28 and be in contact with the Si layer 10a via the openings 29. Here, the tunnel BaSi layer 14 also horizontally grows to fill the openings 29. Accordingly, the tunnel BaSi layer 14 with excellent crystal characteristics is formed, with the intermediate BaSi layer 28 serving as the template. In other words, the intermediate BaSi layer 28 having the openings 29 to allow the tunnel Si layer 12 and the tunnel BaSi layer 14 to be in direct contact with each other is formed at the interface between the tunnel Si layer 12 and the tunnel BaSi layer 14. As the tunnel BaSi layer 14 is brought into direct contact with the tunnel Si layer 12 by virtue of the openings 29, the contact characteristics between the tunnel Si layer 12 and the tunnel BaSi layer 14 can be improved as in FIG. 10. It should be noted that the intermediate BaSi layer 28 should have a lower dopant concentration than that of the conductive BaSi layer 32. The openings 29 may be holes that penetrate through the intermediate BaSi layer 28, or may be island-like spaces formed in BaSi.

As shown in FIG. 7A, the intermediate BaSi layer 28 is preferably formed by depositing Ba on the tunnel Si layer 12 of FIG. 12 and causing the Ba to react with the tunnel Si layer 12. The temperature for causing a reaction between Ba and Si is preferably 400 to 700° C. Also, as shown in FIG. 7B, the tunnel BaSi layer 14 of FIG. 12 is preferably formed by vapor-depositing a dopant (such as Sb), Si, and Ba on the intermediate BaSi layer 28 and the tunnel Si layer 12. In FIG. 7A illustrating Embodiment 2, to form the intermediate BaSi layer 28, the substrate temperature is set at such a temperature that Ba reacts with Si, when Ba 27 is vapor-deposited on the tunnel Si layer 12. However, the substrate temperature may be increased after the Ba vapor deposition, so that Ba reacts with Si. Although Sb is used as the n-type dopant in Embodiment 2, As or the like may be used. Also, B is used as the p-type dopant, but Al or the like may be used. Further, as described in Embodiment 1, the BaSi layers may include a group II element (or an alkaline-earth metal) such as Sr.

[Embodiment 3]

Figure 13:
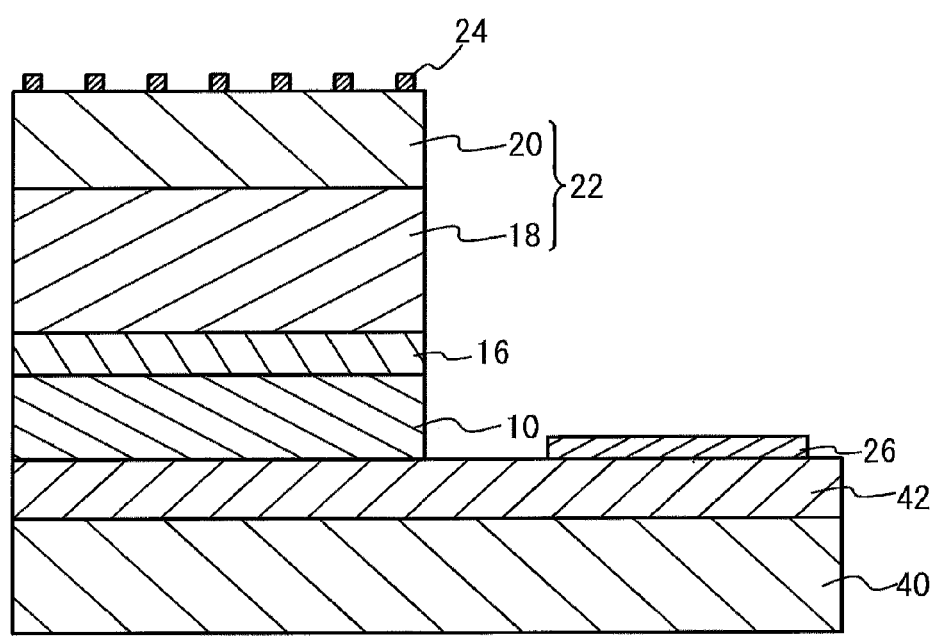
FIG. 13 is a cross-sectional view of a solar cell according to Embodiment 3.

FIG. 13 is a cross-sectional view of a solar cell according to Embodiment 3. As shown in FIG. 13, a conductive layer 42 is formed on an insulating substrate 40. A Si layer 10 is formed on the conductive layer 42. A first electrode 26 is formed on the conductive layer 42. The other aspects are the same as those of Embodiment 1 or 2, and therefore, explanation of them is omitted herein. An insulating substrate such as a glass substrate or a silicon oxide substrate made of SiO$_2$ or the like can be used as the insulating substrate 40. A metal layer such as an Al-added ZnO (zinc oxide) layer or the like can be used as the conductive layer 42. The film thickness of the conductive layer 42 can be 500 to 1000 nm, for example. The Si layer 10 is a (111)-oriented polycrystalline Si layer or a single-crystal Si layer, and the film thickness of the Si layer 10 can be 50 to 500 nm, for example.

Figure 14A:
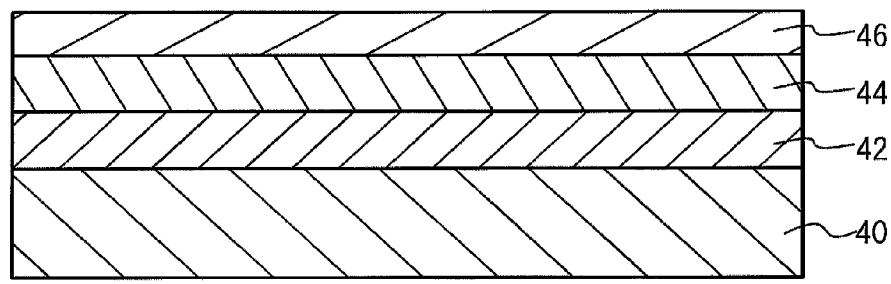
FIGS. 14A through 14C are cross-sectional views illustrating (the first half of) a method of forming the solar cell according to Embodiment 3.

Referring now to FIGS. 14A through 15C, an example of a method of manufacturing the solar cell according to Embodiment 3 is described. As shown in FIG. 14A, the conductive layer 42 that is an Al-doped ZnO layer is formed on the insulating substrate 40 that is a SiO$_2$ substrate. An Al layer 44 is formed on the conductive layer 42. An amorphous Si layer 46 is formed on the Al layer 44. In this manner, an amorphous Si layer is obtained by forming a Si layer on a layer such as the Al layer 44 having a different lattice constant from that of Si.

Figure 14B:
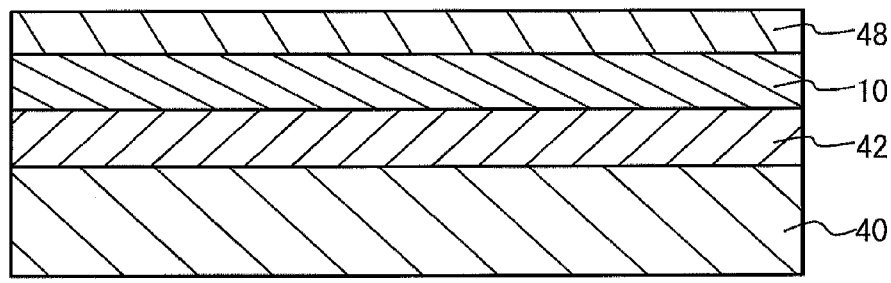
Figure 14C:
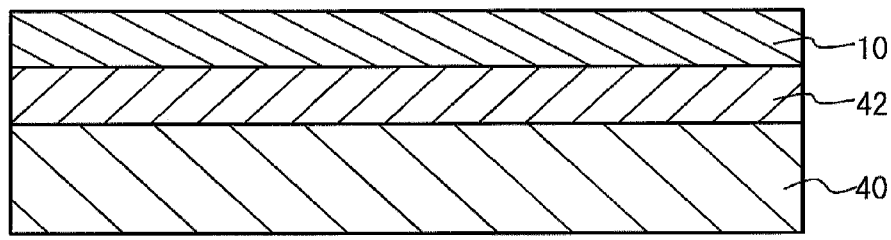

As shown in FIG. 14B, heating is performed at 500° C. for approximately 10 hours in a nitrogen atmosphere, so that the amorphous Si layer 46 and the Al layer 44 exchange with each other. Through this process, the conductive layer 42 is not modified. Meanwhile, the (111)-oriented polycrystalline Si layer 10 is formed on the conductive layer 42. An Al layer 48 is formed on the Si layer 10. As shown in FIG. 14C, the Al layer 48 is removed.

Figure 15A:
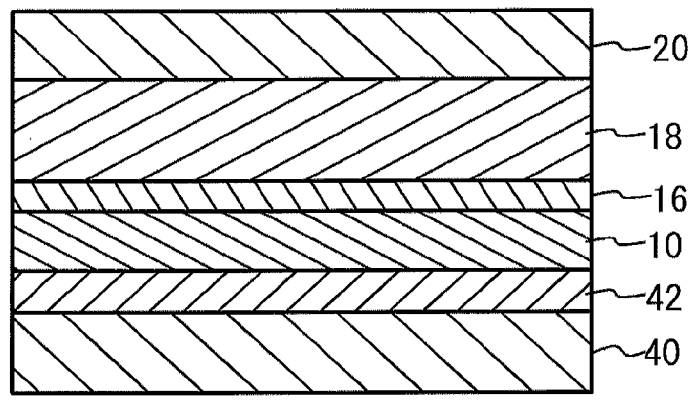
FIGS. 15A through 15C are cross-sectional views illustrating (the second half of) the method of manufacturing the solar cell according to Embodiment 3.
Figure 15B:
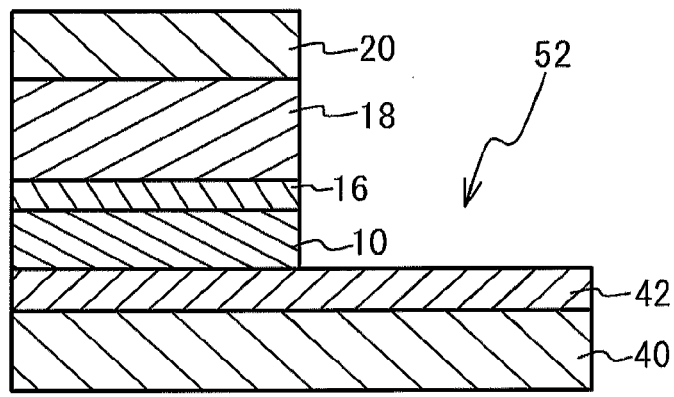
Figure 15C:
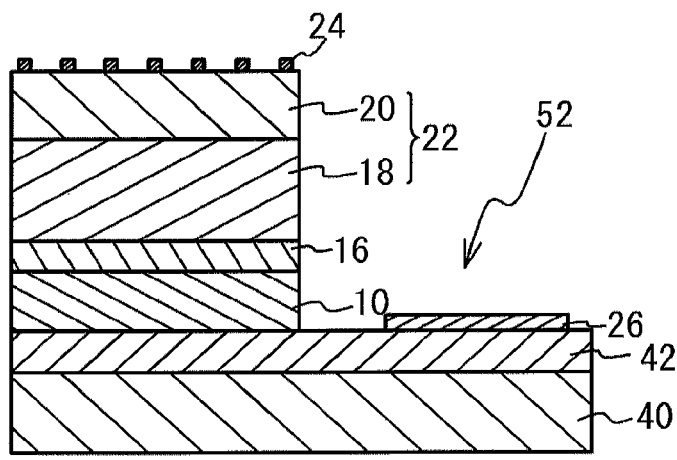

As shown in FIG. 15A, the tunnel junction layer 16, the second BaSi layer 18, and the first BaSi layer 20 are formed on the Si layer 10, as in Embodiment 1 or 2. As shown in FIG. 15B, some portions of layers ranging from the first BaSi layer 20 down to the Si layer 10 are selectively removed, to form an opening 52. As shown in FIG. 15C, the first electrode 26 is formed on a portion of the conductive layer 42 at the bottom of the opening 52. The second electrode 24 is formed on the first BaSi layer 20. In this manner, the solar cell according to Embodiment 3 illustrated in FIG. 13 is completed.

In Embodiment 3, the conductive layer 42 is provided between the insulating substrate 40 and the Si layer 10, and the first electrode 26 supplies carriers into the Si layer 10 via the conductive layer 42. With this arrangement, even where the Si layer 10 is formed above the insulating substrate 40 as in Non-Patent Literature 1, the first electrode 26 to supply carriers into the Si layer 10 can be readily formed.

[Embodiment 4]

Embodiment 4 is an example in which the film thickness of the intermediate BaSi layer of Embodiment 2 illustrated in FIGS. 7A and 7B is varied. The film forming periods for the intermediate BaSi layers 28 in samples A through C (the samples A and B being equivalent to Embodiment 4) were 0.5 minute, one minute, and five minutes, respectively. As a result, the film thicknesses of the intermediate BaSi layers 28 calculated from the film forming rates in the samples A through C are equivalent to 1, 2, and 10 nm, respectively. The other film forming conditions are same as those in FIGS. 7A and 7B. Table 3 is a table showing the conditions of the samples A and C.

TABLE 3

|  | SAMPLE A | SAMPLE B | SAMPLE C |
|---|---|---|---|
| FILM FORMING PERIOD FOR INTERMEDIATE BaSi LAYER 28 | 0.5 MIN. | 1.0 MIN. | 5.0 MIN. |
| FILM THICKNESS OF INTERMEDIATE BaSi LAYER 28 | 1 nm | 2 nm | 10 nm |

Figure 16:
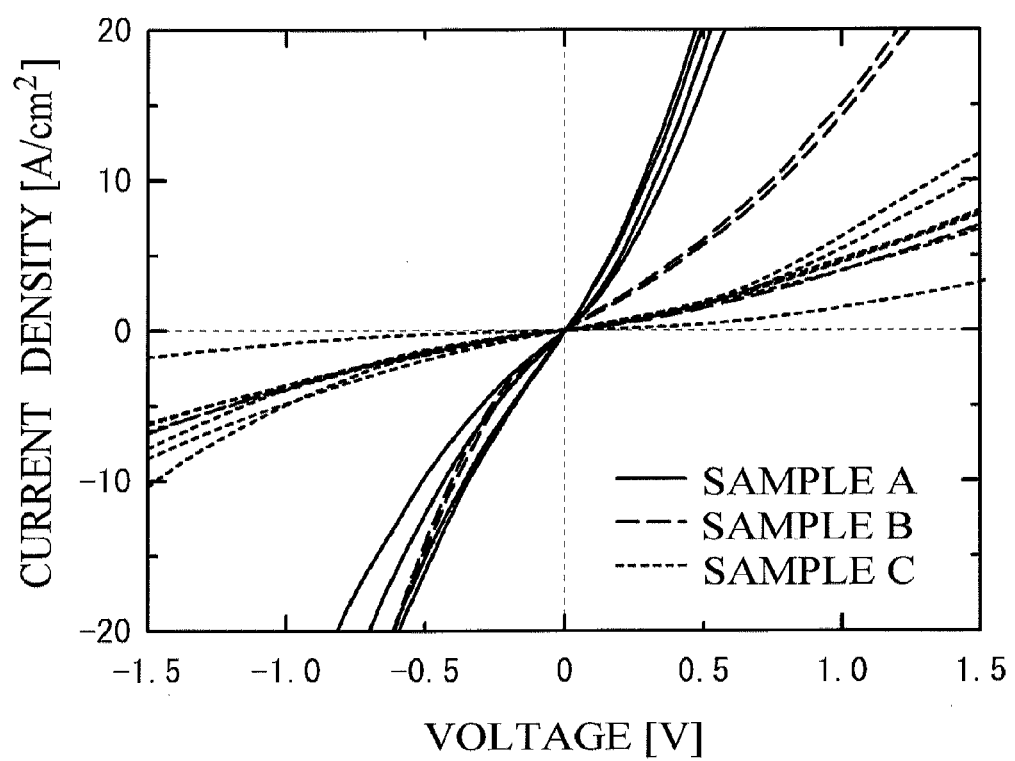
FIG. 16 is a graph showing the current-voltage characteristics between the Si layer and the conductive BaSi layer in each of samples A through C.

FIG. 16 is a graph showing the current-voltage characteristics between the Si layer 10a and the conductive BaSi layer 32 of each of the samples A through C. The solid lines indicate the results of measurement carried out on the sample A. The dashed lines indicate the results of measurement carried out on the sample B. The dotted lines indicate the results of measurement carried out on the sample C. Each of the samples A through C is represented by more than one curve indicating the results of measurement carried out on more than one samples. As shown in FIG. 16, the voltage-current characteristics of the sample A are similar to ohmic characteristics. The voltage-current characteristics of the sample B is similar to ohmic characteristics, but exhibit a higher resistance than that of the sample A. The voltage-current characteristics of the sample C exhibit an even higher resistance.

Figure 17A:
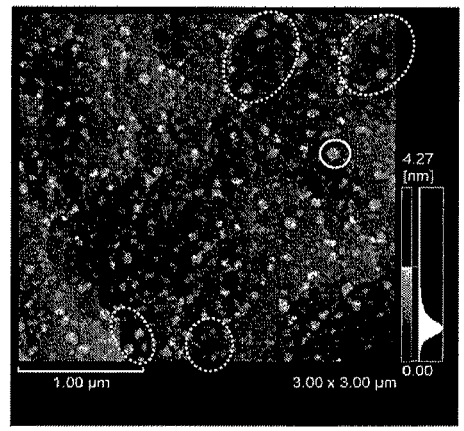
FIGS. 17A through 17C are AFM images of the surface after the formation of the intermediate BaSi layer in each of the samples A through C.
Figure 17B:
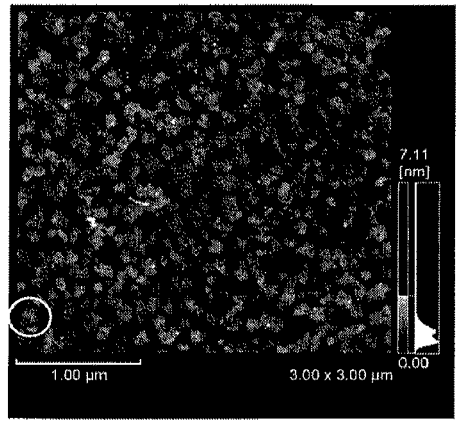
Figure 17C:
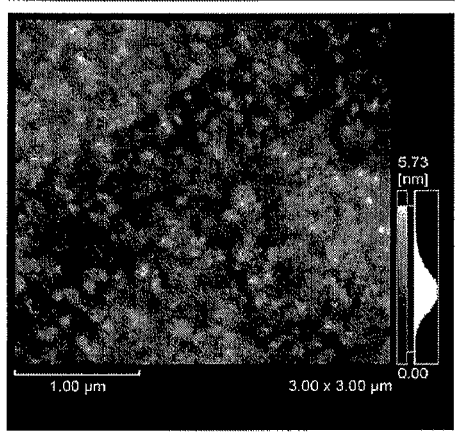
Figure 18A:
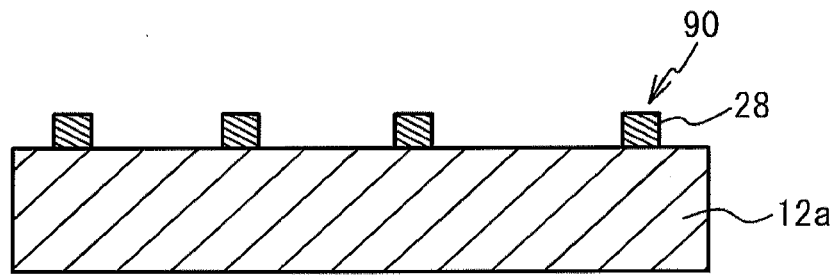
FIGS. 18A through 18C are assumed cross-sectional views of the structures shown in FIGS. 17A through 17C.
Figure 18B:
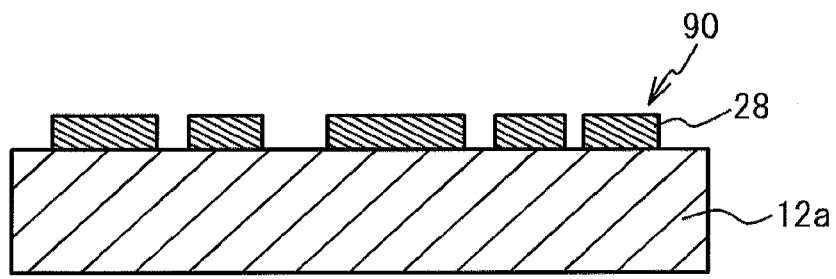
Figure 18C:
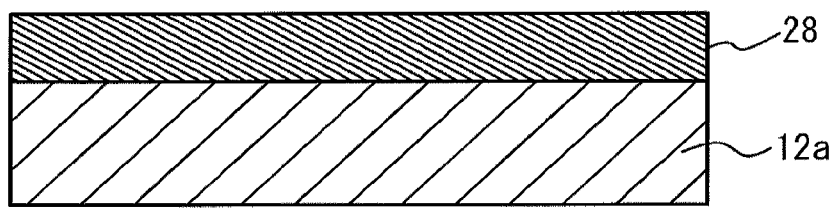

FIGS. 17A through 17C are AFM (Atomic Force Microscope) images of surfaces captured after the respective intermediate BaSi layers 28 of the samples A through C were formed (the situation illustrated in FIG. 7A). FIGS. 18A through 18C are assumed cross-sectional views of the structures shown in FIGS. 17A through 17C, respectively. In FIG. 17A, there exist portions with rapid changes in contrast.

Those portions are considered to be islands 90 of BaSi. Black linear regions 92 are considered to be steps of the Si substrate. In the sample A, cores of the intermediate BaSi layer 28 are supposedly scattered as the islands 90 on the high-concentration Si layer 12a, as shown in FIG. 18A. In this situation, large openings exist in the intermediate BaSi layer 28. Therefore, when the conductive BaSi layer 32 is formed, the areas of the direct-contact portions between the high-concentration Si layer 12a and the conductive BaSi layer 32 are large. Accordingly, the resistance of the sample A is low, as indicated by the solid lines in FIG. 16.

In FIG. 17B, the density of the portions considered to be the islands 90 of BaSi is higher, and some of the islands 90 are in contact with each other. As shown in FIG. 18B, in the sample B, the horizontal growth supposedly starts from the cores of the intermediate BaSi layer 28 on the high-concentration Si layer 12a, and the island-like high-concentration Si layer 12a becomes larger. The islands are then in contact with one another, and grow into larger islands. In this situation, the openings in the intermediate BaSi layer 28 become smaller. Therefore, when the conductive BaSi layer 32 is formed, the areas of the direct-contact portions between the high-concentration Si layer 12a and the conductive BaSi layer 32 are smaller than those in FIG. 18A. Accordingly, the resistance of the sample B is slightly higher, as indicated by the dashed lines in FIG. 16.

In FIG. 17C, portions that appear to be the islands of BaSi are hardly observed. As shown in FIG. 18C, in the sample C, the intermediate BaSi layer 28 on the high-concentration Si layer 12a is considered to be continuous in the horizontal direction. In this situation, the undoped intermediate BaSi layer 28 is continuously formed between the high-concentration Si layer 12a and the conductive BaSi layer 32. As the film forming period for the intermediate BaSi layer 28 is made longer, the film thickness of the intermediate BaSi layer 28 becomes greater. Accordingly, the resistance of the sample C becomes higher, as indicated by the dotted lines in FIG. 16.

As described above, it was confirmed that the contact resistance between the Si layer 10a and the conductive BaSi layer 32 can be made lower by forming the intermediate BaSi layer 28 having the openings 29 to expose a layer surface on the Si layer 10a. Also, as can be seen from FIG. 16, to lower the contact resistance, the film forming period for the intermediate BaSi layer 28 in the process of forming the intermediate BaSi layer 28 of FIG. 7A is preferably such a period in terms of the film forming rate that the film thickness of the intermediate BaSi layer 18 becomes 2 nm or smaller. More preferably, the film thickness of the intermediate BaSi layer 28 is 1 nm or smaller. The film forming period in terms of the film forming rate is the film forming period calculated by dividing the film thickness by the film forming rate.

[Embodiment 5]

Figure 19A:
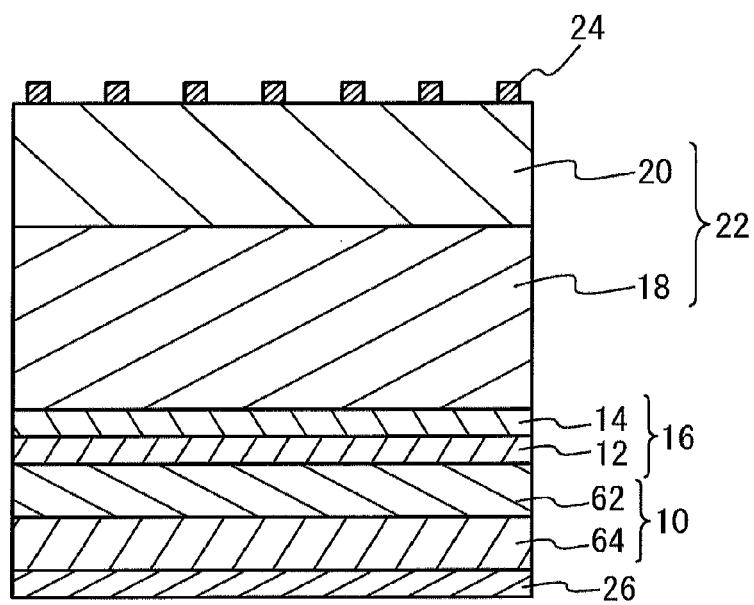
FIGS. 19A and 19B are cross-sectional views of solar cells according to Embodiment 5.
Figure 19B:
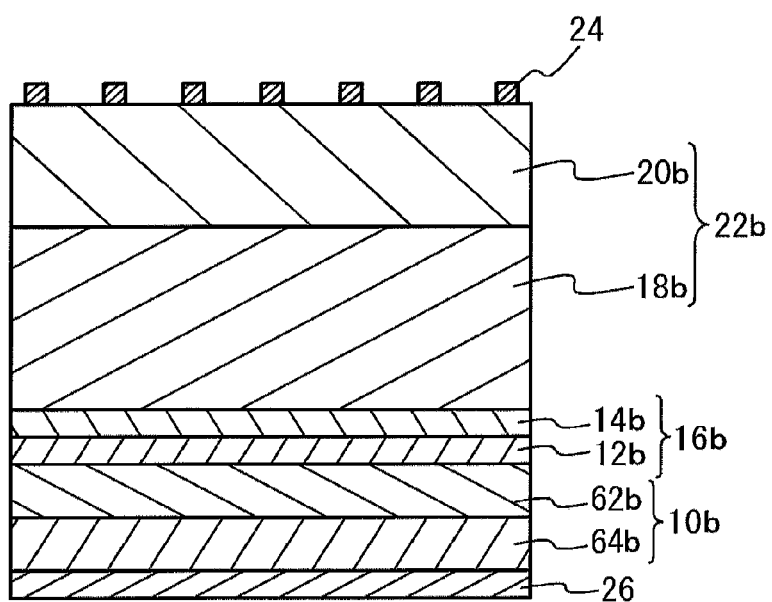

Embodiment 5 concerns examples of solar cells of tandem types. FIGS. 19A and 19B are cross-sectional views of solar cells according to Embodiment 5. In the example shown in FIG. 19A, the Si layer 10 includes an n-type second Si layer 64 and a p-type first Si layer 62 formed on the n-type second Si layer 64. The tunnel junction layer 16 and the BaSi layer 22, which are the same as those of Embodiments 1 through 4, are formed on the p-type first Si layer 62. The tunnel junction layer 16 includes the p-type tunnel Si layer 12 formed on the p-type first Si layer 62, and the n-type tunnel BaSi layer 14 formed on the tunnel Si layer 12. The BaSi layer 22 includes the n-type second BaSi layer 18 formed on the tunnel BaSi layer 14, and the p-type first BaSi layer 20 formed on the second BaSi layer 18. The second electrode 24 to which carriers are to be supplied from the first BaSi layer 20 of the BaSi layer 22 is formed on the BaSi layer 22. The first electrode 26 to which carriers are to be supplied from the Si layer 10 is formed under the second Si layer 64 of the Si layer 10. The film thickness of the Si layer 10 is 50 to 200 μm, for example, and the film thickness of the BaSi layer 22 is 1 to 2 for example.

In the example shown in FIG. 19B, a Si layer 10b includes a p-type second Si layer 64b and an n-type first Si layer 62b formed on the p-type second Si layer 64b. A tunnel junction layer 16b and a BaSi layer 22b that are the same as those of Embodiments 1 through 4 are formed on the n-type first Si layer 62b. The tunnel junction layer 16b includes an n-type tunnel Si layer 12b formed on the n-type first Si layer 62b, and a p-type tunnel BaSi layer 14b formed on the tunnel Si layer 12b. The BaSi layer 22b includes a p-type second BaSi layer 18b formed on the tunnel BaSi layer 14b, and an n-type first BaSi layer 20b formed on the second BaSi layer 18b.

In FIGS. 19A and 19B, the intermediate BaSi layer 28, which is the same as those of Embodiments 2 through 4, may be formed between the tunnel Si layer 12 and the tunnel BaSi layer 14.

According to Embodiment 5, the Si layer 10 has a pn junction. Accordingly, photovoltaic power is also generated in the Si layer 10, and a solar cell can be formed. As described above, the BaSi layer 22 has a wider bandgap than that of Si. Therefore, short-wavelength light is converted into electrical energy by the BaSi layer 22, and long-wavelength light is converted into electrical energy by the Si layer. In this manner, a solar cell with a high photoelectric efficiency can be realized.

The first Si layer 62 is preferably of the same conductivity type as that of the tunnel Si layer 12, so that a pn junction is not formed between the first Si layer 62 and the tunnel Si layer 12. That is, where the second Si layer 64 is of the second conductivity type while the first Si layer 62 is of the first conductivity type, the second BaSi layer 18 is preferably of the second conductivity type, and the first BaSi layer 20 is preferably of the first conductivity type.

[Embodiment 6]

Figure 20A:
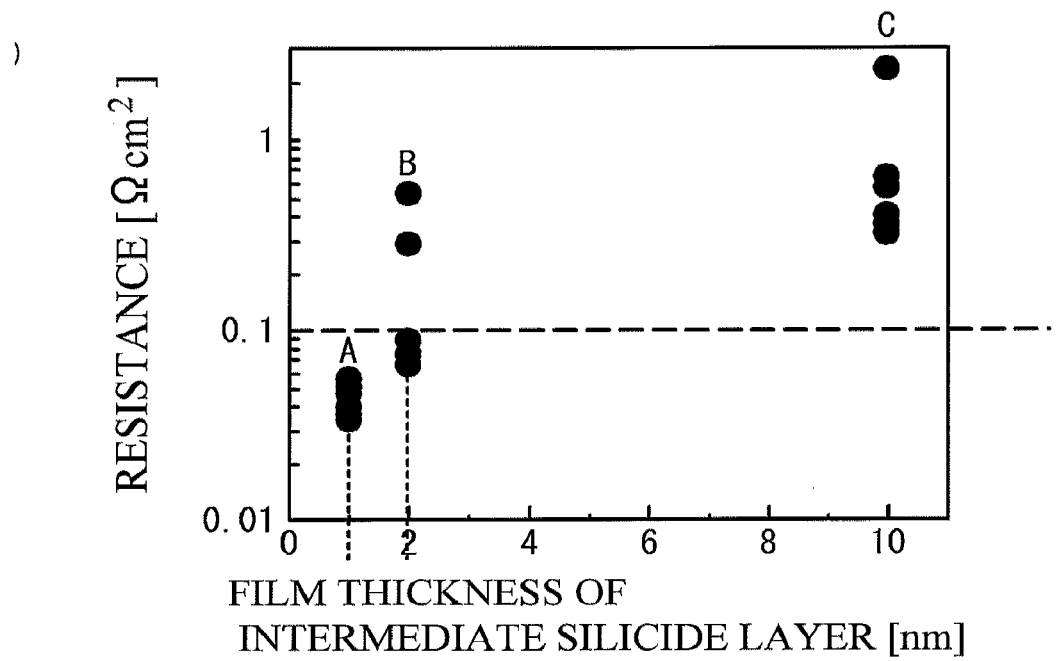
FIGS. 20A and 20B are graphs showing resistances and aperture ratios with respect to the film thickness of the intermediate BaSi layer.
Figure 20B:
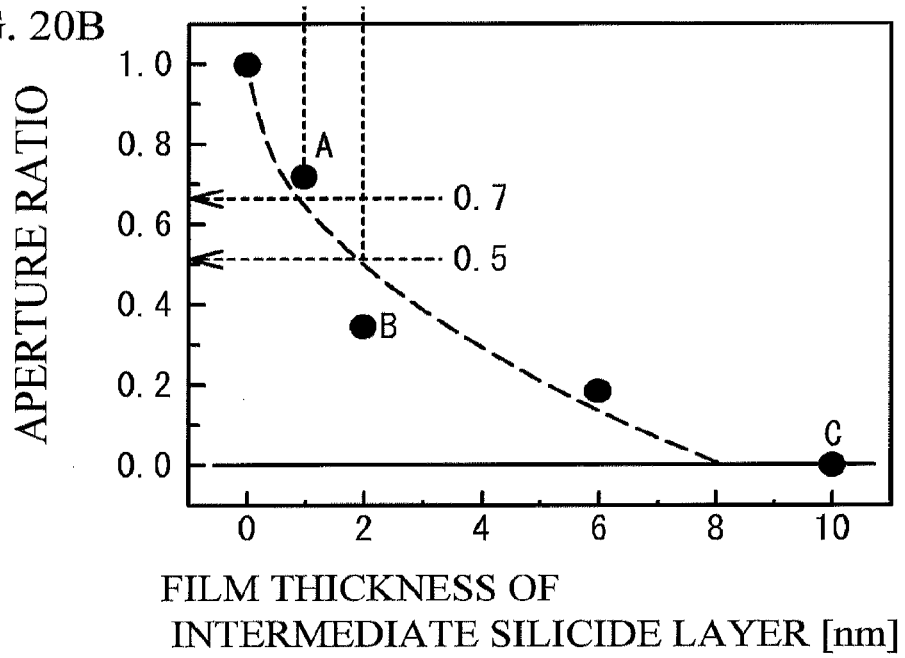

Embodiment 6 is an example case where a preferred range of aperture ratio is determined from the results of Embodiment 4. FIGS. 20A and 20B are graphs showing resistances and aperture ratios with respect to the film thickness of the intermediate BaSi layer 28. In FIG. 20A, the ordinate axis indicates the resistance per unit cross-sectional area determined from the voltage-current characteristics shown in FIG. 16. The resistance values were calculated from the current density obtained at the time of application of a voltage of 0.1 V. The plotted points where the film thicknesses of the intermediate BaSi layers 28 are 1, 2, and 10 nm correspond to the samples A, B, and C of Embodiment 4, respectively. FIG. 20B shows the aperture ratios determined from FIGS. 17A through 17C. In FIGS. 18A and 18B, the non-covering portions between the covering portions of the intermediate BaSi layer 28 that covers the high-concentration Si layer 12a were formed into openings. Each aperture ratio indicates the ratio of the areas of the openings to the total area. In FIG. 20B, other than the samples A through C of Embodiment 4, a sample in which the film thickness of the intermediate BaSi layer 28 was 0 nm (the intermediate BaSi layer 28 was not formed), and a sample in which the film thickness of the intermediate BaSi layer 28 was 6 nm were formed, and the aperture ratios in those samples were measured.

The aperture ratios with respect to the film thickness of the intermediate BaSi layer 28 are now examined. As is apparent from the AFM images shown in FIGS. 17A through 17C, the growth of the intermediate BaSi layer 28 is not step-flow growth but island growth. For ease of explanation, each island is a circular cone having a radius R and a height H.

Here, the volume Vi of each island is expressed by the following equation:

$$Vi = (1/3)\pi R^2 H$$

Where the number of islands is N, the volume V of the intermediate BaSi layer 28 is expressed by the following equation:

$$V = (1/3)\pi R^2 HN$$

The volume V of the intermediate BaSi layer 28 is proportional to the supplied amount of Ba, and therefore, is proportional to time. Accordingly, where C represents proportional constant, and t represents time, the volume V is expressed by the following equation:

$$V = Ct = (1/3)\pi R^2 HN$$

Here, the following formula is established:

$$NR^2 \propto t/H(t)$$

Also, the height of the islands of the intermediate BaSi layer 28 depends on diffusion of Ba into Si (or diffusion of Si into Ba). Accordingly, the height is expressed by the following formula using the diffusion model of atoms in crystal growth:

$$H \propto \sqrt{t}$$

The proportion of the islands of the intermediate BaSi layer 28 covering the silicon layer surface (1-aperture ratio) is represented by $NR^2$. Therefore, the following equation is established:

$$(1\text{-aperture ratio}) = NR^2 \propto \sqrt{t} \propto \sqrt{(\text{film thickness of the intermediate BaSi layer 28})}$$

The dashed line in FIG. 20B is a curve that is drawn using the above model formula, so as to follow the experimental values (black circles).

Figure 21:
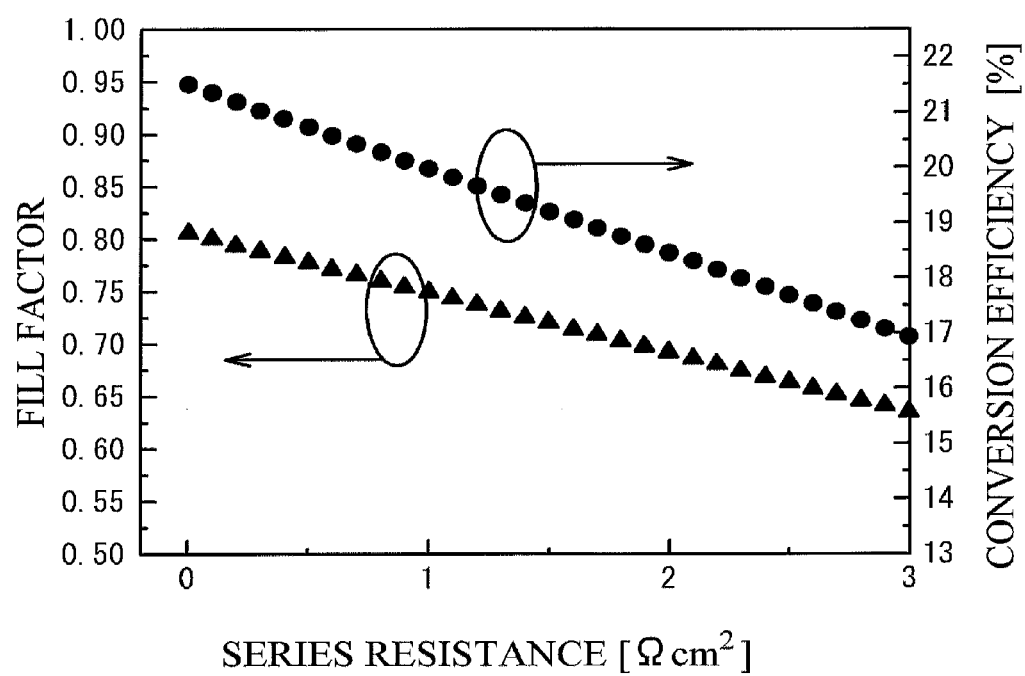
FIG. 21 is a graph showing the conversion efficiency and the fill factor with respect to the series resistance in a solar cell.

FIG. 21 is a graph showing the conversion efficiency and the fill factor with respect to the series resistance in a solar cell. FIG. 21 shows the conversion efficiency and the fill factor in a conventional solar cell on the basis of the inventor's experience. As shown in FIG. 21, the conversion efficiency and the fill factor become lower as the series resistance becomes higher. In the example shown in FIG. 21, the conversion efficiency becomes approximately 2% lower when the series resistance increases to 1 $\Omega cm^2$. Therefore, the series resistance is preferably low. The series resistance in a semiconductor device including a solar cell is greatly affected by the contact resistance between a semiconductor and an electrode, and the resistance of the semiconductor. For example, the contact resistance between a semiconductor and an electrode, and the resistance of the semiconductor are approximately 1 $\Omega cm^2$. To prevent the contact resistance between a silicon layer (such as the high-concentration Si layer 12a) and a silicide layer (such as the conductive BaSi layer 32) from affecting the characteristics of a semiconductor device such as a solar cell, the contact resistance between the silicon layer and the silicide layer is preferably 0.1 $\Omega cm^2$ or lower, which is ten or more times as small as 1 $\Omega cm^2$.

As can be seen from FIG. 20A, the resistance in the sample B is approximately 0.1 $\Omega cm^2$. Therefore, the aperture ratio is preferably 0.5 or higher, according to FIG. 20B. Further, to reduce the contact resistance between the silicon layer and the silicide layer, the resistance is preferably 0.03 $\Omega cm^2$, as in the sample A of FIG. 20A. Therefore, the aperture ratio is preferably 0.7 or higher, according to FIG. 20B.

In a case where the aperture ratio is 1, the intermediate BaSi layer 28 is not formed on the high-concentration Si layer 12a. Therefore, the crystal characteristics of the high-concentration BaSi layer 32 become poor as shown in FIG. 6B. If a small amount of the intermediate BaSi layer 28 is formed on the high-concentration Si layer 12a, the high-concentration BaSi layer 32 can be formed with excellent crystal characteristics, with islands of the intermediate BaSi layer 28 being cores. Therefore, the aperture ratio should preferably be lower than 1.

As described so far, in each of solar cells according to Embodiments 2 through 4 and Embodiment 6, an intermediate silicide layer (the intermediate BaSi layer 28, for example) including barium silicide is formed on a silicon layer (the high-concentration Si layer 12a, for example), and has openings. An upper silicide layer (the high-concentration BaSi layer 32, for example) that has a higher dopant concentration than that of the intermediate silicide layer and includes barium silicide is formed to cover the intermediate silicide layer and be in contact with the silicon layer through the openings. With this arrangement, excellent electrical contact can be achieved between the silicon layer and the upper silicide layer.

Further, as in Embodiment 6, the aperture ratio of the openings of the intermediate silicide layer is preferably 0.5 or higher and is smaller than 1. More preferably, the aperture ratio is 0.7 or higher and is smaller than 1.

Further, the silicon layer preferably has a higher dopant concentration than that of the intermediate silicide layer. Since the silicon layer and the upper silicon layer form a tunnel junction layer, the silicon layer and the upper silicide layer are preferably of different conductivity types from each other.

In the above embodiments, an example of a semiconductor device is a solar cell. However, a semiconductor device may be a transistor or the like, as long as the semiconductor device has a silicide layer formed on a silicon layer.

Also, the method of forming the intermediate silicide layer has been described as a method of forming the intermediate silicide layer by depositing barium on the silicon layer and causing the barium to react with the silicon layer, as in Embodiment 2 illustrated in FIG. 7A. Further, the method of forming the upper silicide layer shown in FIG. 7B has been described as a method of forming the upper silicide layer by simultaneously vapor-depositing a dopant, silicon, and barium on the intermediate silicide layer and the silicon layer. Other than those methods, a sputtering technique or CVD (Chemical Vapor Deposition) may be used to form the intermediate silicide layer and the upper silicide layer.

Further, as in Embodiment 1, a solar cell includes a silicon layer (the Si layer 10, for example), a tunnel junction layer formed on the silicon layer, and a pn junction that is formed on the tunnel junction layer and is formed with a silicide layer (the BaSi layer 22, for example) including barium silicide. As the tunnel junction is included in this manner, the contact resistance between the silicon layer and the silicide layer can be made lower.

Further, to form a tunnel junction, the tunnel junction layer preferably includes a tunnel silicon layer (the tunnel Si layer 12, for example) that has a higher dopant concentration than that of the silicon layer and is of the same conductivity type (the first conductivity type) as that of the silicon layer, and a tunnel silicide layer (the tunnel BaSi layer 14, for example) that is formed on the tunnel silicon layer, is of the opposite conductivity type (the second conductivity type) of the first conductivity type, and includes barium silicide. Meanwhile, the silicide layer preferably includes a second silicide layer (the second BaSi layer 18, for example) that is formed on the tunnel junction layer, has a lower dopant concentration than that of the tunnel silicide layer, is of the second conductivity type, and includes barium silicide, and a first silicide layer (the first baSi layer) that is formed on the second silicide layer, is of the first conductivity type, and includes barium silicide.

The silicide layer is preferably made of barium silicide (or is formed as barium silicide crystals in such a manner that a dopant or the like is included as an impurity, for example). To increase the conversion efficiency of the solar cell, the silicide layer is preferably made of strontium-barium silicide (or is formed as strontium-barium silicide crystals in such a manner that a dopant or the like is included as an impurity, for example).

Although preferred embodiments of the present invention have been described so far, the present invention is not limited to those specific embodiments, and various changes and modifications may be made to them within the scope of the invention claimed herein.

The invention claimed is:

1. A semiconductor device comprising:
   a silicon layer;
   an intermediate silicide layer that is provided on the silicon layer, has an opening, and includes barium silicide; and
   an upper silicide layer that covers the intermediate silicide layer, is positioned to be in contact with the silicon layer through the opening, has a higher dopant concentration than a dopant concentration of the intermediate silicide layer, and includes barium silicide.

2. The semiconductor device as claimed in claim 1, wherein an aperture ratio of the opening is 0.5 or higher and is lower than 1.

3. The semiconductor device as claimed in claim 1, wherein the silicon layer has a higher dopant concentration than the dopant concentration of the intermediate silicide layer.

4. The semiconductor device as claimed in claim 1, wherein the silicon layer and the upper silicide layer are of different conductivity types from each other.

5. The semiconductor device as claimed in claim 4, wherein the silicon layer and the upper silicide layer form a tunnel junction.

6. The semiconductor device as claimed in claim 1, wherein the intermediate silicide layer and the upper silicide layer are made of barium silicide.

7. A method of manufacturing a semiconductor device, comprising:
   forming an intermediate silicide layer on a silicon layer, the intermediate silicide layer having an opening to expose a surface of the silicon layer, the intermediate silicon layer including barium silicide; and
   forming an upper silicide layer to cover the intermediate silicide layer and be in contact with the silicon layer through the opening, the upper silicide layer having a higher dopant concentration than a dopant concentration of the intermediate silicide layer, the upper silicide layer including barium silicide,
   the forming the intermediate silicide layer including depositing barium on the silicon layer and causing the barium to react with the silicon layer.

8. The method as claimed in claim 7, wherein
   the forming the upper silicide layer includes simultaneously vapor-depositing a dopant, silicon, and barium on the intermediate silicide layer and the silicon layer.

9. A solar cell comprising:
   a silicon layer;
   a tunnel junction layer formed on the silicon layer;
   a pn junction that is formed on the tunnel junction layer, and includes a silicide layer including barium silicide;
   a first electrode having carriers supplied thereinto from the silicon layer; and
   a second electrode having carriers supplied thereinto from the silicide layer.

10. The solar cell as claimed in claim 9, wherein
    the silicon layer is of a first conductivity type,
    the tunnel junction layer includes: a tunnel silicon layer that is formed on the silicon layer, has a higher dopant concentration than a dopant concentration of the silicon layer, and is of the first conductivity type; and a tunnel silicide layer that is formed on the tunnel silicon layer, is of a second conductivity type, and includes barium silicide, the second conductivity type being the opposite conductivity type of the first conductivity type, and
    the silicide layer includes: a second silicide layer that is formed on the tunnel junction layer, has a lower dopant concentration than a dopant concentration of the tunnel silicide layer, is of the second conductivity type, and includes barium silicide; and a first silicide layer that is formed on the second silicide layer, is of the first conductivity type, and includes barium silicide.

11. The solar cell as claimed in claim 10, further comprising
    an intermediate silicide layer that is formed at an interface between the tunnel silicon layer and the tunnel silicide layer, has an opening to allow direct contact between the tunnel silicon layer and the tunnel silicide layer, has a lower dopant concentration than the dopant concentration of the tunnel silicide layer, and includes barium silicide.

12. The solar cell as claimed in claim 11, wherein an aperture ratio of the opening is 0.5 or higher and is smaller than 1.

13. The solar cell as claimed in claim 9, wherein the silicide layer is made of barium silicide.

14. The solar cell as claimed in claim 9, wherein the silicide layer is made of strontium-barium silicide.

* * * * *